United States Patent
Dehe

(10) Patent No.: US 9,856,134 B2
(45) Date of Patent: Jan. 2, 2018

(54) MICROELECTROMECHANICAL SYSTEM AND A METHOD OF MANUFACTURING A MICROELECTROMECHANICAL SYSTEM

(71) Applicant: Infineon Technologies AG, Neubiberg (DE)

(72) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 15/054,299

(22) Filed: Feb. 26, 2016

(65) Prior Publication Data
US 2017/0247244 A1    Aug. 31, 2017

(51) Int. Cl.
*H01L 29/82*    (2006.01)
*B81B 3/00*    (2006.01)
*B81C 1/00*    (2006.01)

(52) U.S. Cl.
CPC ........ *B81B 3/0021* (2013.01); *B81C 1/00325* (2013.01); *B81B 2201/0257* (2013.01); *B81B 2203/0118* (2013.01); *B81B 2203/0127* (2013.01); *B81B 2203/04* (2013.01); *B81B 2207/012* (2013.01)

(58) Field of Classification Search
CPC . H01L 2224/48091; H01L 2224/49109; H01L 2224/48137; H01L 2924/00017
See application file for complete search history.

(56) References Cited

U.S. PATENT DOCUMENTS

| 6,522,762 | B1 | 2/2003 | Mullenborn et al. |
| 6,535,460 | B2 | 3/2003 | Loeppert et al. |
| 2009/0232336 | A1 | 9/2009 | Pahl |
| 2012/0161257 | A1 | 6/2012 | Friza et al. |
| 2015/0041929 | A1 | 2/2015 | Bolognia |

FOREIGN PATENT DOCUMENTS

EP    0561566 A2    9/1993

*Primary Examiner* — Samuel Gebremariam
(74) *Attorney, Agent, or Firm* — Viering, Jentschura & Partner mbB

(57) ABSTRACT

A microelectromechanical system and a method for manufacturing a microelectromechanical system including: a substrate; a microelectromechanical device including: a diaphragm configured as a transducer to convert between electrical energy and mechanical energy and an electrode coupled to the diaphragm; a support region mechanically coupling the microelectromechanical device to the substrate, wherein the support region is confined to a first continuous region spanning an arc of less than 90 degrees around a perimeter of the diaphragm; and a second continuous region free from mechanical support of the microelectromechanical device to the substrate, the second continuous region spanning the perimeter of the diaphragm from one end of the support region to the other end of the support region; wherein the support region cantilevers the microelectromechanical device and the second continuous region mechanically decouples the microelectromechanical device from the substrate.

20 Claims, 12 Drawing Sheets

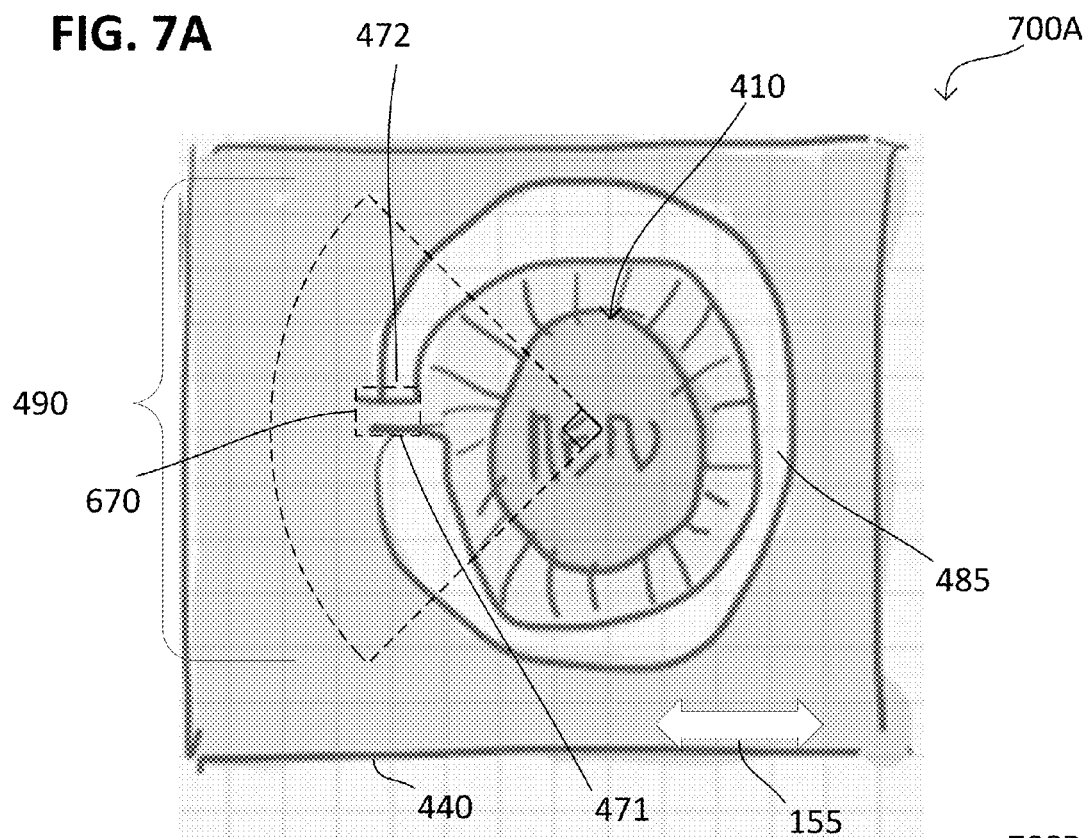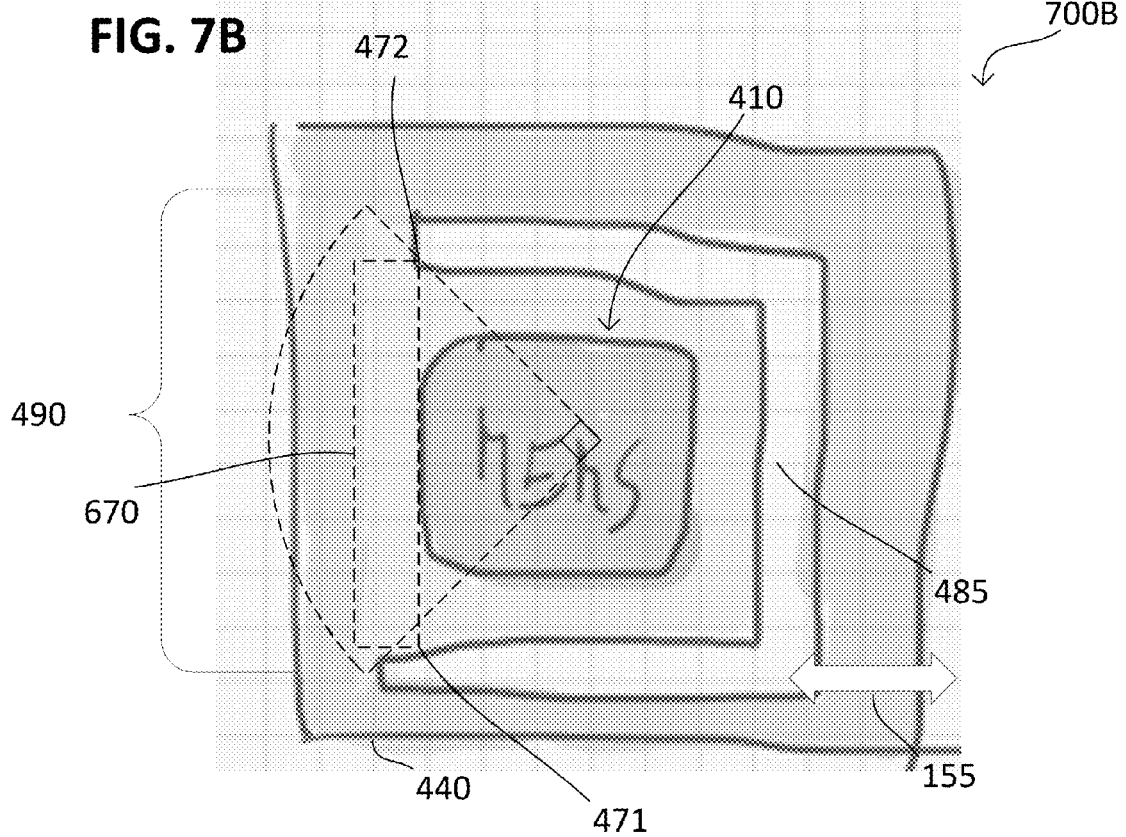

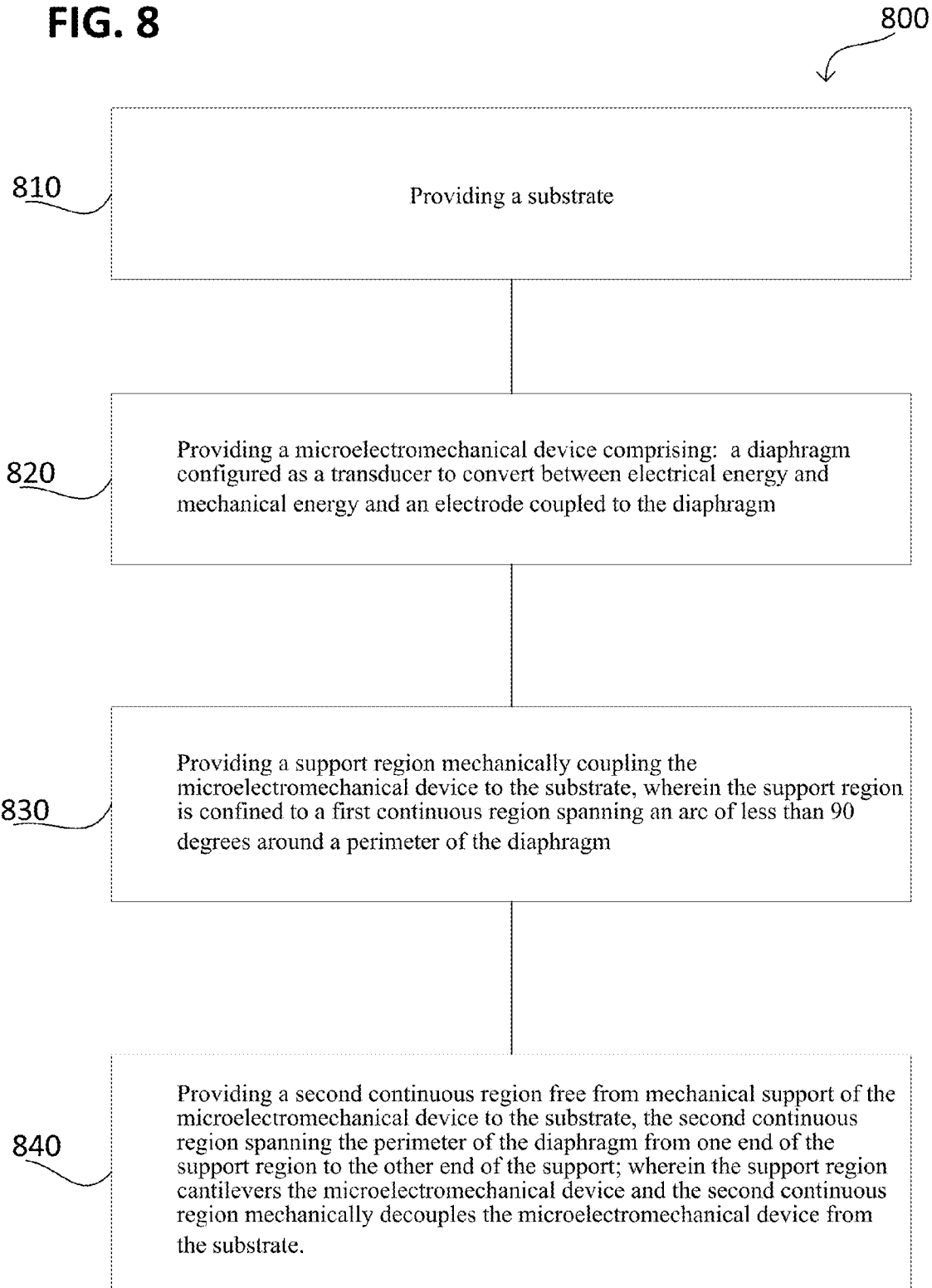

MICROELECTROMECHANICAL SYSTEM AND A METHOD OF MANUFACTURING A MICROELECTROMECHANICAL SYSTEM

TECHNICAL FIELD

Various embodiments relate generally to a microelectromechanical system and a method of manufacturing a microelectromechanical system.

BACKGROUND

Microelectromechanical systems (MEMS) may provide highly sensitive and useful devices, such as microphones and loudspeakers, on the micro-scale. A MEMS microphone may have at least one electrode and a diaphragm and function as a transducer.

In general, a semiconductor chip (which may also be referred to as a die, chip, or microchip) may be processed by semiconductor technologies on and/or in a wafer (or a substrate or a carrier). The semiconductor chip may include one or more MEMS, which are formed during semiconductor technology processing.

During processing, the semiconductor chip may be mechanically stressed. For example, mechanical stress may occur during singulation of the semiconductor chip from the wafer, during handling of the semiconductor chip by positioning systems (e.g., Pick and Place applications), during thermal treatment of the semiconductor chip, e.g., during encapsulation or soldering of the semiconductor chip. Alternatively or additionally, the semiconductor chip may be mechanically stressed during operation of the readily processed chip. For example, mechanical stress may occur due to thermal fluctuations during operation of the chip.

Such mechanical stresses (also referred to as mechanical loads) may be transferred to the MEMS on or in the semiconductor chip, which may lead to a deformation (also referred to as strain) of the microelectromechanical system. The impact of mechanical stress on the MEMS (or a device operating the MEMS) may result in an uncontrolled or undefined behavior of the MEMS, e.g., malfunction or inaccurate function (e.g., inaccurate measurement results), and/or may damage the MEMS. For example, a MEMS and/or a device operating the MEMS (especially silicon microphones) would be sensitive to stress due to assembly or thermal fluctuations. In other words, due to factors related to assembly and the bulk of the substrate of the MEMS device, stress coupled into the MEMS structure may cause changes in the structure and sensitivity of the device. After assembly, the deformation of the MEMS may remain, which complicates the fabrication of accurate working devices. MEMS with a high sensitivity are especially affected by the stress arising from assembly.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7A shows a top view of a stress-decoupled microelectromechanical system.

FIG. 7B shows a top view of a stress-decoupled microelectromechanical system.

FIG. 8 shows a method for manufacturing a microelectromechanical system.

DESCRIPTION

Figure 1A:
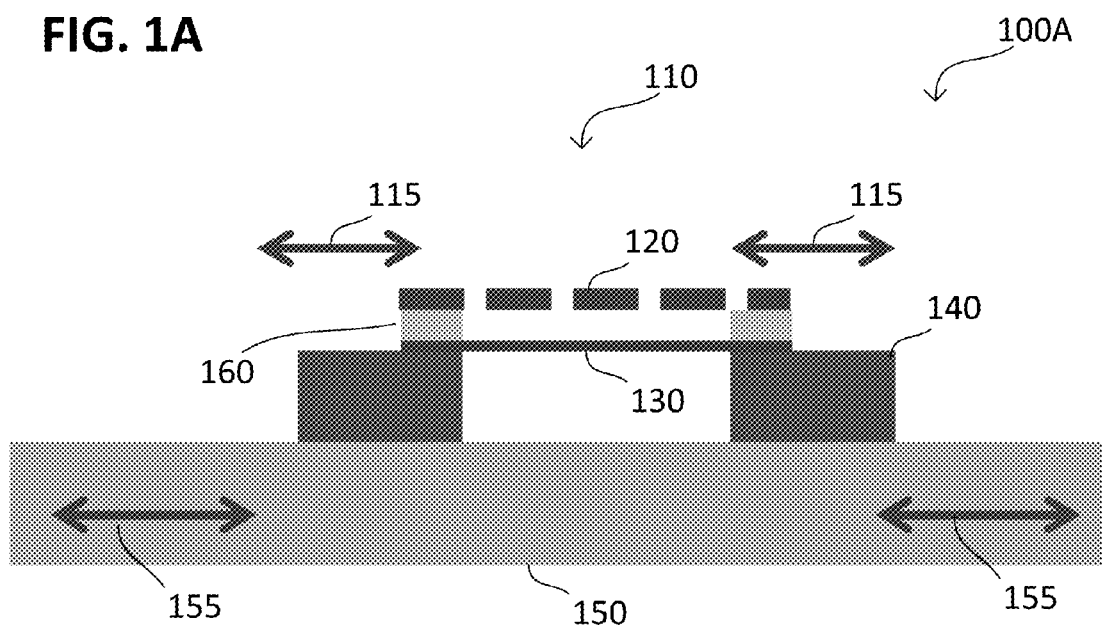
FIG. 1A & FIG. 1B show stress coupling in microelectromechanical system cross-sections.

The following detailed description refers to the accompanying drawings that show, by way of illustration, specific details and embodiments in which the invention may be practiced. In the following drawings, similar or the same elements may have similar or the same reference numerals (e.g., microelectromechanical device 110, microelectromechanical device 210, microelectromechanical device 410). A description of the element may, in the interests of brevity, be omitted in a subsequent descriptions.

The word "exemplary" is used herein to mean, "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g., in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Likewise, the phrase, "around a perimeter" of a diaphragm, "spanning a perimeter" of a diaphragm or "spanning an arc", may be used herein to mean the subject is "directly adjacent" or "contiguous" with the perimeter or arc. The phrase may be used herein to mean the subject is "indirectly adjacent" or "noncontiguous" with the perimeter or the arc (e.g., located remotely from the diaphragm or arc, i.e., loosely following a path of the diaphragm or the arc), with one or more elements or materials being arranged between the implied side or surface, i.e., intervening, and the subject.

As used herein, a "circuit" may be understood as any kind of logic (analog or digital) implementing entity, which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a non-transitory computer readable medium, for example a computer program using a virtual machine code such as, for example, Java. Any other kind of implementation of the respective functions which will be described in more detail below may also be understood as a "circuit". It is understood that any two (or more) of the described circuits may be combined into a single circuit with substantially equivalent functionality, and, conversely, that any single described circuit may be distributed into two (or more) separate circuits with substantially equivalent functionality. In particular with respect to the use of "circuitry" in the Claims included herein, the use of "circuit" may be understood as collectively referring to two or more circuits.

The term "forming" may refer to disposing, arranging, structuring, or depositing. A method for forming, e.g., a layer, a material, or a region, etc., may include various deposition methods which, inter alia, may include: chemical vapor deposition, physical vapor deposition (e.g., for dielectric materials), electrodeposition (which may also be referred to as electroplating, e.g., for metals or metal alloys), or spin coating (e.g., for fluid materials). Generally, a vapor deposition may be performed by sputtering, laser ablation, cathodic arc vaporization, or thermal evaporation. A method for forming metals may include metal plating, e.g., electroplating or chemical plating.

The term "forming" may also include a chemical reaction or fabrication of a chemical composition, where, for example, at least a portion of the layer, the material, or the region is formed by a transformation of one set of chemical substances into the chemical composition. "Forming" may, for example, include: changing the positions of electrons by breaking or forming chemical bonds between atoms of the set of chemical substances. The term "forming" may further include oxidation and reduction, complexation, precipitation, acid-base reaction, solid-state reaction, substitution, doping, addition and elimination, diffusion, or a photochemical reaction. "Forming" may, for example, change the chemical and physical properties of the set of chemical substances which chemically compose a portion of the layer, material, or region. Exemplary chemical properties or physical properties may include electrical conductivity, phase composition, or optical properties, etc. "Forming" may, e.g., include the application of a chemical reagent to an initial compound to change the chemical and physical properties of the initial compound.

The term "structuring" may refer to modifying the form of a structure (e.g., modifying the structure to achieve a desired shape or a desired pattern). To structure, e.g., a material, a portion of the material may be removed, e.g., via etching. To remove material from, for example a layer, material, or region, a mask (that provides a pattern) may be used, i.e., the mask provides a pattern for removing material (e.g., etching a structure to remove material of the structure) according to the pattern of the mask. Illustratively, the mask may prevent regions (which may be intended to remain) from being removed (e.g., by etching). Alternatively or additionally, to structure the layer, the material or the region of material may be disposed using a mask (the mask providing a pattern). The mask may provide a pattern for forming (e.g., disposing) material in accordance with the pattern of the mask.

In general, removing material may include a process such as etching of the material. The term "etching" may include various etching procedures, e.g., chemical etching (including, for example, wet etching or dry etching), physical etching, plasma etching, ion etching, etc. In etching a layer, a material, or a region, an etchant may be applied to the layer, the material, or the region. For example, the etchant may react with the layer, the material, or the region, forming a substance (or chemical compound) which may be easily removed, e.g., a volatile substance. Alternatively or additionally, the etchant may, for example, vaporize the layer, the material, or the region.

The mask may be a temporary mask, i.e., it may be removed after etching (e.g., the mask may be formed from a resin or a metal or another material such as a hard mask material such as silicon oxide, silicon nitride or carbon, etc.) or the mask may be a permanent mask (e.g., a mask-blade), which may be used several times. A temporary mask may be formed, e.g., using a photomask.

According to various embodiments, a microelectromechanical device may be formed as part of, or may include, a semiconductor chip. For example, the semiconductor chip may include the microelectromechanical system (which may also be referred to as a microelectromechanical component). In other words, the microelectromechanical system may be implemented into (e.g., may be part of) a semiconductor chip, e.g., monolithically integrated. The semiconductor chip (which may also be referred to as a chip, die, or microchip) may be processed in semiconductor technologies, on a wafer, or in a wafer (or, e.g., a substrate or a carrier). The semiconductor chip may include one or more microelectromechanical systems (MEMS), which are formed during semiconductor technology processing or fabrication. The semiconductor substrate may be part of the semiconductor chip, e.g., the semiconductor substrate may be part of, or may form, the semiconductor body of the chip. Optionally, the microelectromechanical component may be part of, or may be electrically coupled to, an integrated circuit on the chip.

According to various embodiments, a semiconductor substrate (e.g., of a microelectromechanical device, e.g., the semiconductor substrate of a semiconductor chip) may be singulated from a wafer by removing material from a kerf region of the wafer (also referred to as dicing or cutting the wafer). For example, removing material from the kerf region of the wafer may be processed by scribing and breaking, cleavage, blade dicing, or mechanical sawing (e.g., using a dicing saw). In other words, the semiconductor substrate may be singulated by a wafer dicing process. After the wafer dicing process, the semiconductor substrate (or the finished microelectromechanical device) may be electrically contacted and encapsulated, e.g., by mold materials, into a chip carrier (which may also be referred to as a chip housing) which may then be suitable for use in electronic devices, such as gauges. For example, the semiconductor chip may be bonded to a chip carrier by wires. Furthermore, the semiconductor chip (which may be bonded to a chip carrier) may be mounted (e.g., soldered) onto a printed circuit board.

According to various embodiments, a semiconductor substrate (e.g., of a microelectromechanical device or the semiconductor substrate of a semiconductor chip) may include or may be made of (in other words, formed from) semiconductor materials of various types, including a group IV semiconductor (e.g., silicon or germanium), a compound semiconductor, e.g., a group III-V compound semiconductor (e.g., gallium arsenide), or other types, including group III semiconductors, group V semiconductors, or polymers, for example. In an embodiment, the semiconductor substrate may be made of silicon (doped or undoped). In an alternative embodiment, the semiconductor substrate may be a silicon on insulator (SOI) wafer. As an alternative, any other suitable semiconductor material may be used for the semiconductor substrate, for example, semiconductor compound material such as gallium phosphide (GaP), indium phosphide (InP), or any suitable ternary semiconductor compound material, such as indium gallium arsenide (InGaAs), or quaternary semiconductor compound material, such as aluminium gallium indium phosphide (AlInGaP).

According to various embodiments, a semiconductor substrate (e.g., of a microelectromechanical device or the semiconductor substrate of a semiconductor chip) may be covered with a passivation layer for protecting the semiconductor substrate from environmental influence, e.g., oxidation. The passivation layer may include a metal oxide, an oxide of the semiconductor substrate (which may also be referred to as a substrate or semiconductor body), e.g., silicon oxide, a nitride, e.g., silicon nitride, a polymer, e.g., benzocyclobutene (BCB) or polyimide (PI), a resin, a resist, or a dielectric material.

According to various embodiments, an electrically conductive material may include or may be formed from: a metal, a metal alloy, an intermetallic compound, a silicide (e.g., titanium silicide, molybdenum silicide, tantalum silicide, or tungsten silicide), a conductive polymer, a polycrystalline semiconductor, or a highly doped semiconductor, e.g., polycrystalline silicon (which may also be referred to as polysilicon), or a highly doped silicon. An electrically conductive material may be understood as material with moderate electrical conductivity, e.g., with an electrical conductivity (measured at room temperature and constant electric field direction) greater than about 10 S/m, e.g., greater than about $10^2$ S/m, or with high electrical conductivity, e.g., greater than about $10^4$ S/m, e.g., greater than about $10^6$ S/m.

According to various embodiments, a metal may include or may be formed from one element of the following group of elements: aluminum, copper, nickel, magnesium, chromium, iron, zinc, tin, gold, silver, iridium, platinum, or titanium. Alternatively or additionally, a metal may include or may be formed from a metal alloy including one element or more than one element. For example, a metal alloy may include an intermetallic compound, e.g., an intermetallic compound of gold and aluminum, an intermetallic compound of copper and aluminum, an intermetallic compound of copper and zinc (brass) or an intermetallic compound of copper and tin (bronze).

According to various embodiments, a dielectric material, e.g., an electrically insulating material, may be understood as material with poor electrical conductivity, e.g., with an electrical conductivity (measured at room temperature and constant electric field direction) less than about $10^{-2}$ S/m, e.g., less than about $10^{-5}$ S/m, or, e.g., less than about $10^{-7}$ S/m.

According to various embodiments, a dielectric material may include a semiconductor oxide, a metal oxide, a ceramic, a semiconductor nitride, a metal nitride, a semiconductor carbide, a metal carbide, a glass, e.g., fluorosilicate glass (FSG), a dielectric polymer, a silicate, e.g., hafnium silicate or zirconium silicate, a transition metal oxide, e.g., hafnium dioxide or zirconium dioxide, an oxynitride, e.g., silicon oxynitride, or any other type of dielectric material. A dielectric material may withstand an electric field without breaking down (in other words without experiencing failure of its insulating properties, e.g., without substantially changing its electrical conductivity).

According to various embodiments, a microelectromechanical device may be configured to at least one of: provide a force to actuate a diaphragm in response to an electrical signal transmitted to an electrode and provide an electrical signal in response to an actuation of the diaphragm. In general, a microelectromechanical device may be configured to transfer mechanical energy into electrical energy and/or electrical energy into mechanical energy. In other words, a microelectromechanical component may function as a transducer that is configured to convert mechanical energy into electrical energy or vice versa. A microelectromechanical device may have a size (e.g., a diameter or a lateral width) in the range from about a few micrometers (μm) to about a few millimeters (mm), e.g., in the range from about a 10 μm to about 5 mm, e.g., in the range from about a 100 μm to about 2 mm, e.g., about 1 mm, e.g., in the range of 0.5 mm to 1.5 mm, or, alternatively, smaller than about 1 mm, e.g., smaller than 500 μm, e.g., smaller than 100 μm. A microelectromechanical device according to various embodiments may be processed in semiconductor technology.

A microelectromechanical device according to various embodiments may be used as a sensor (e.g., a micro-sensor) for sensing a mechanical signal and to generate an electrical signal which represents the mechanical signal. Alternatively, a microelectromechanical component may be used as an actuator for generating a mechanical signal based on the electrical signal. For example, the microelectromechanical device may be used as microphone or as a speaker (loudspeaker).

The microelectromechanical device may include a diaphragm. The diaphragm may be configured to actuate in response to a force. The force may be provided externally from the microelectromechanical device, i.e., the force may not originate from the microelectromechanical device. The force may be a mechanical interaction, i.e., a pressure-gradient, e.g., a mechanical wave (including acoustic waves or sound waves), pressure, such as gauge pressure. Additionally or alternatively, the force may be an electric field interaction, i.e., a Coulomb force or an electrostatic force, or may be a magnetic field interaction, e.g., magnetic force, such as Lorentz force, etc. An electrically-conductive component, e.g., an electrode or a sensor, may provide an electrical signal in response to the actuation of the diaphragm. The electrical signal may represent the force on the diaphragm or the actuation of the diaphragm (e.g., or the electrical signal may be proportional to the force).

Additionally or alternatively, the force to actuate the diaphragm may be provided by the microelectromechanical system, i.e., the force may originate from an element of the microelectromechanical system. For example, the force may be provided by an electrically-conductive component, e.g., an electrode that is part of the microelectromechanical system. The electrically-conductive component may provide a force to actuate the diaphragm in response to an electrical signal transmitted to the electrically-conductive component. The electrical signal may be transmitted by an electronic circuit, e.g., a controller or a processor. The electrically-conductive component may exert a force on the diaphragm by an electric field interaction, a magnetic field interaction, or a combination thereof.

FIG. 1A shows system 100A of stress coupling in microelectromechanical device 110. Microelectromechanical device 110 includes diaphragm 130 coupled to electrode 120 by dielectric material 160. Microelectromechanical device 110 may be on a substrate 140. As depicted here, an entire perimeter of the diaphragm of microelectromechanical device 110 is fixed to substrate 140.

Substrate 140 is mounted on layer 150, e.g., a printed circuit board (PCB). Layer 150 may have at least one conductive path and an insulator (not pictured here). The conductive path(s) may be formed from an electrically conductive material.

As discussed above, layer 150 may experience mechanical stress 155 for various reasons, e.g., thermally induced deformation. Application of the substrate 140 to layer 150 (e.g., mechanical coupling) may introduce mechanical stresses 115 into microelectromechanical device 110. Mechanical stress 115 in microelectromechanical device 110 may, for example, disadvantageously affect the sensitivity of the MEMS.

Figure 1B:
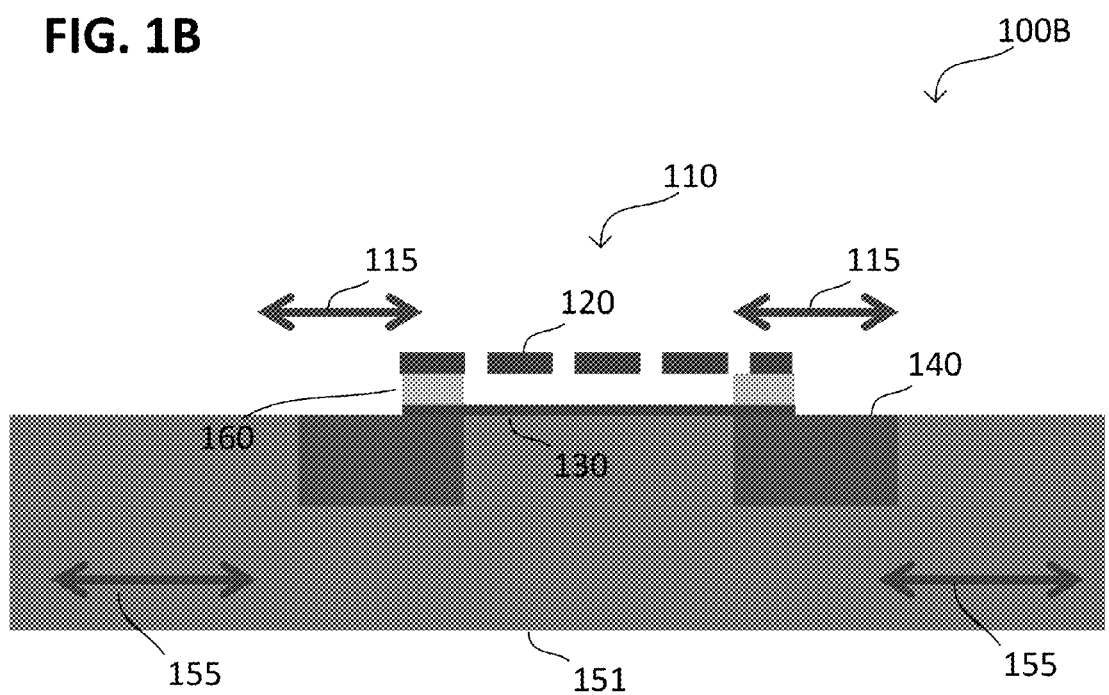

FIG. 1B shows system 100B of stress coupling in microelectromechanical system 110. Here, microelectromechanical device 110 on substrate 140 is embedded in an encapsulant 151 (e.g., a mold compound or resin). Encapsulant 151 may experience mechanical stress 155. Stress 155 may be inherent in encapsulant 151 due to the thermal formation process of encapsulant 151 (e.g., heating and cooling of the material of encapsulant 151). As discussed above, stress 155 may be introduced into encapsulant 151 from subsequent processing.

Microelectromechanical device 110 may experience stress 115 due to mechanical coupling with encpasulant 151. Similarly to illustration 100A, mechanical stress 115 in microelectromechanical device 110 may, for example, disadvantageously affect the sensitivity of the MEMS.

Figure 2A:
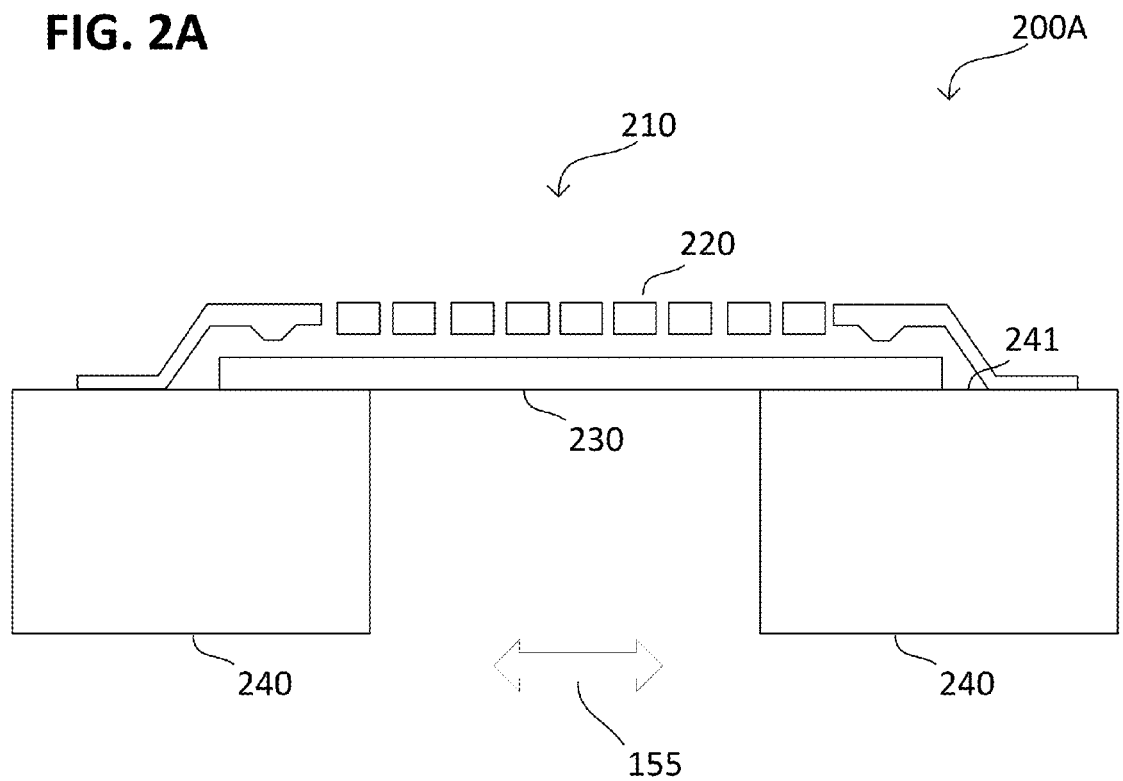
FIG. 2A shows a cross-section of a microelectromechanical system with a stress-decoupled diaphragm.

FIG. 2A shows a cross-section of microelectromechanical device 210 with a stress-decoupled diaphragm 230 of microelectromechanical system 200. Microelectromechanical device 210 also includes electrode 220. Diaphragm 230 and electrode 220 are on substrate 240.

Diaphragm 230 is simply supported on substrate 240, i.e., substrate 240 supports diaphragm 230 in a normal direction (perpendicular) to surface 241. However, diaphragm 230 is free to move laterally on the supporting surface 241 of substrate 240. Accordingly, diaphragm 230 is decoupled from stress 155 in lateral directions.

Figure 2B:
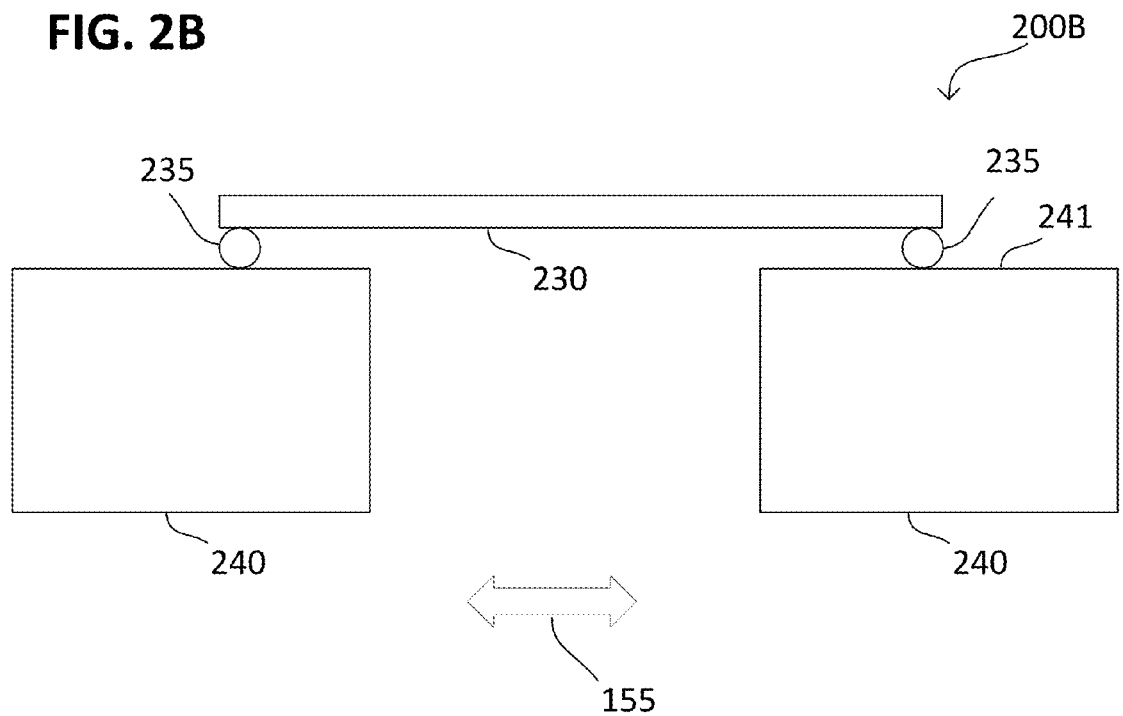
FIG. 2B shows a diagram of a cross-section of the stress-decoupled diaphragm.

FIG. 2B shows a diagram of a cross-section of microelectromechanical device 210 with a stress-decoupled diaphragm 230 of microelectromechanical system 200. As can be seen (in cross-section), an outer region of diaphragm 230 has a simple support 235 on surface 241 of substrate 240. Diaphragm 230 may, therefore, freely move in any lateral direction.

Figure 3A:
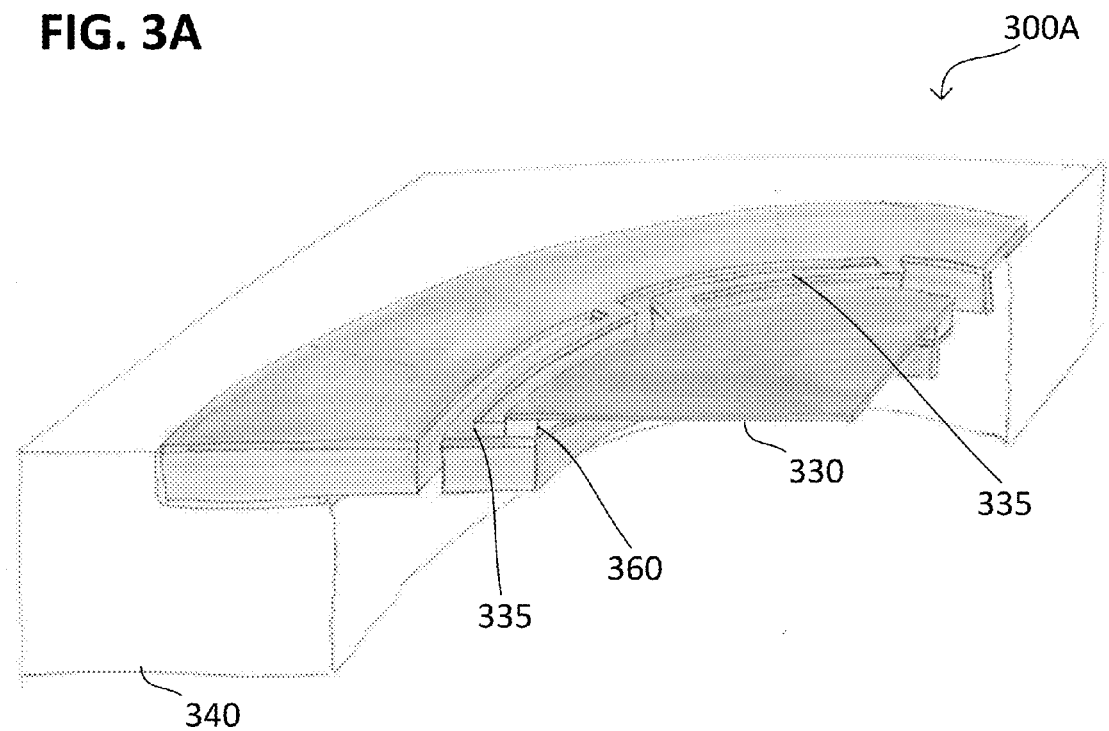
FIG. 3A shows a cross-section of a stress-decoupled diaphragm.

FIG. 3A shows a cross-section of microelectromechanical system 300 including a diaphragm 330. Diaphragm 330 is coupled to dielectric material 360, which in turn is mechanically coupled via spring arms 335 to substrate 340.

Spring arms 335 resiliently support diaphragm 330, i.e., elastically couple diaphragm 330 to the substrate 340. Accordingly, spring arms 335 are configured to deflect in response to a mechanical load, e.g., stress 155, in order to at least partially absorb the mechanical load, e.g., stress 155.

Figure 3B:
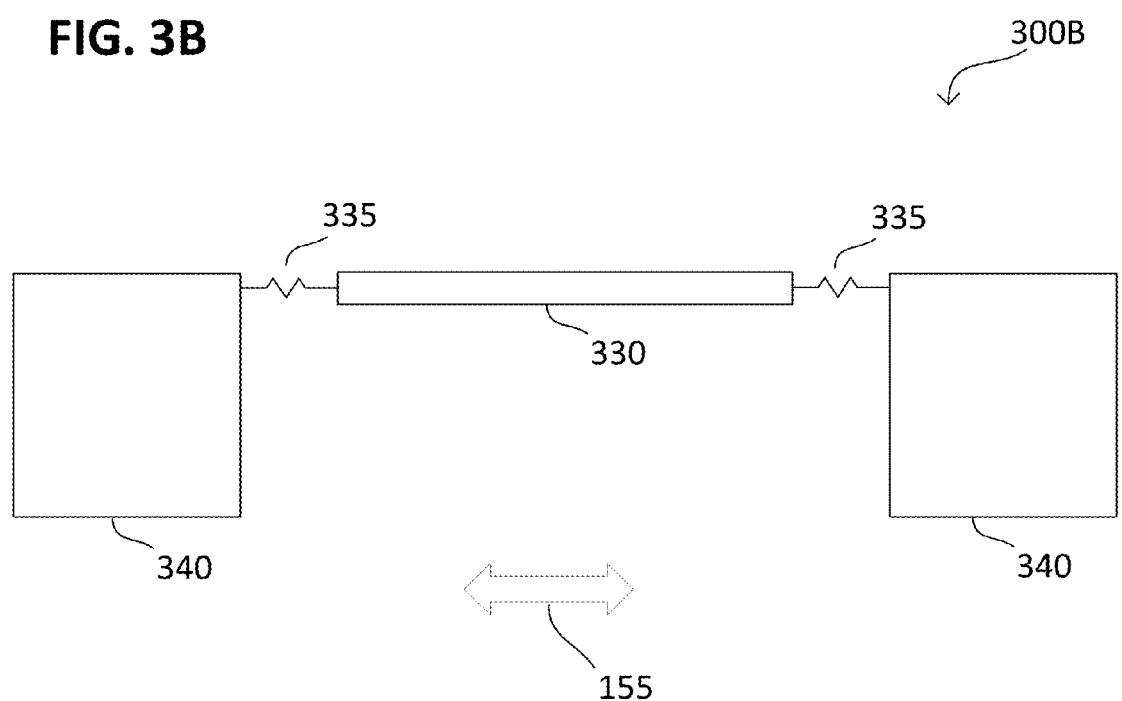
FIG. 3B shows a diagram of a cross-section of the stress-decoupled diaphragm.

Accordingly, FIG. 3B shows a diagram of a cross-section of microelectromechanical system 300 including diaphragm 330. Here, spring arms 335 are depicted with representative springs 335, which may at least partially absorb stress 155, e.g., mechanical load, of substrate 340 on diaphragm 330.

Figure 4A:
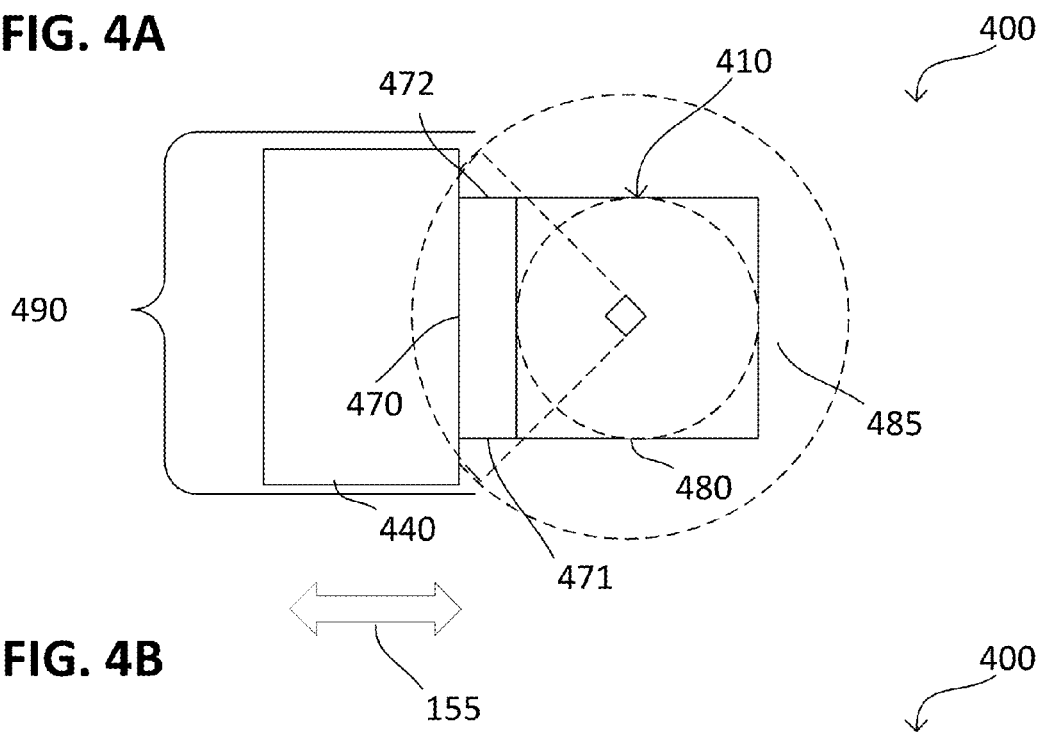
FIG. 4A shows a top view of a stress-decoupled microelectromechanical system.

FIG. 4A shows a top view of a microelectromechanical system 400. The microelectromechanical system 400 may include: substrate 440 and microelectromechanical device 410, which may include a diaphragm (see FIG. 10A) configured as a transducer to convert between electrical energy and mechanical energy, as well as an electrode (see FIG. 10A) coupled to the diaphragm. The microelectromechanical system 400 may further include support region 470 that mechanically couples microelectromechanical device 410 to substrate 440. The smaller the width of the support region, the less stress is coupled into microelectromechanical system 400; which is limited by a square MEMS, for example, which may be completely coupled along one side (with the remaining three sides of the MEMS remaining free, i.e., decoupled).

Support region 470 may be confined to a first continuous region 490 spanning an arc of less than 90 degrees around a perimeter 480 of the diaphragm of microelectromechanical device 410. A second continuous region 485 free from mechanical support of the microelectromechanical device 410 to the substrate 440 may span (e.g., follow along) the perimeter 480 of the diaphragm of microelectromechanical device 410 from one end 471 of the support region 470 to the other end 472 of the support region 470. Support region 470 may cantilever microelectromechanical device 410 and the second continuous region 485 may decouple the microelectromechanical device 410 from the substrate 440.

Perimeter 480 of the diaphragm of microelectromechanical device 410 may have the form of a closed shape configured to function as a transducer, e.g., a circle, and is thus simply represented by perimeter 480 for the purposes of the illustration 400A. The diaphragm itself is confined to the bounds of microelectromechanical device 410 (as will be discussed later).

Accordingly, the microelectromechanical system 400 may be mechanically isolated (i.e., decoupled from stress 155 in substrate 440 in an axis indicated by the arrows of stress 155) by fixing the system at a single point or section along the perimeter of the diaphragm of microelectromechanical device 410. Thus, a stress induced displacement or deformation of substrate 440 may cause a displacement of the MEMS, but stress 155 may be decoupled from substrate 440.

Substrate 440 may include a semiconducting material (i.e., a semiconductor). In an aspect of the disclosure, the microelectromechanical system 400 including the microelectromechanical device 410, substrate 440, and support region 470, may be embedded in an encapsulant (not shown here). Alternatively or additionally, the microelectromechanical system 400 may be mounted on a layer (not shown here). The layer may include an insulator (dielectric material) and at least one conductive path. The at least one conductive path may include an electrically conductive material.

Figure 4B:
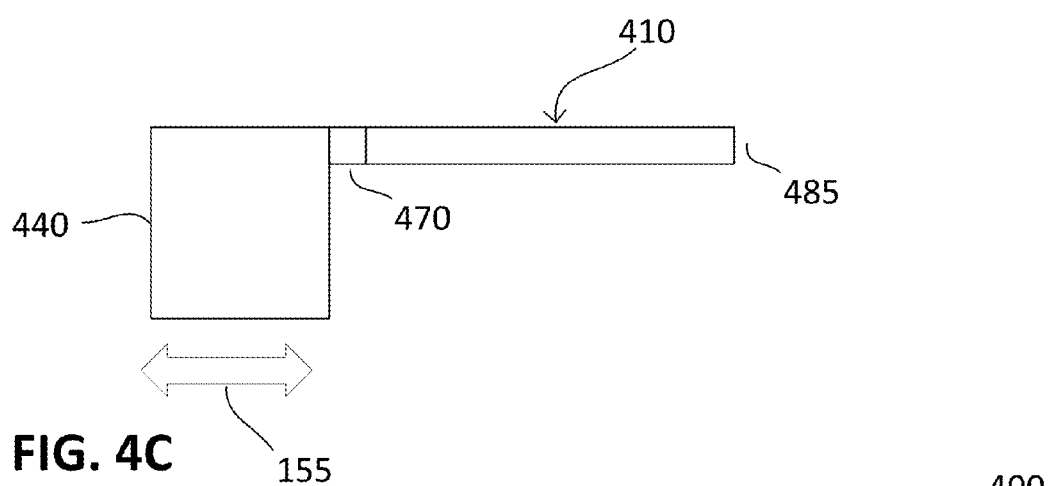
FIG. 4B shows a side view of a cross-section of a stress-decoupled microelectromechanical system.

FIG. 4B shows a side view in reference to FIG. 4A of a cross-section of a microelectromechanical system 400. The microelectromechanical system 400 may include microelectromechanical device 410 coupled mechanically to substrate 440. Second continuous region 485 is laterally adjacent (spanning the perimeter 480 of the diaphragm of microelectromechanical device 410), and as can be seen here, microelectromechanical device 410 is not coupled to substrate 440 in the second continuous region 485 so that stress 155 is decoupled from microelectromechanical device 410.

Figure 4C:
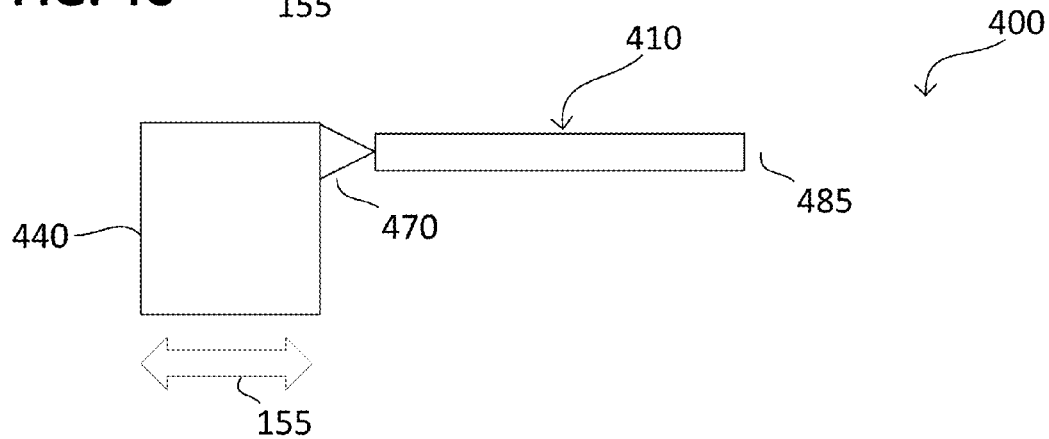
FIG. 4C shows a side view of a diagram of a cross-section of a stress-decoupled microelectromechanical system.

FIG. 4C shows a side view of a diagram of a cross-section of a microelectromechanical system 400. The microelectromechanical system 400 may include microelectromechanical device 410, substrate 440, second continuous region 485 and a triangle representing support region 470. In contrast to diagrams 200B and 300B, support region 470 mechanically fixes microelectromechanical device 410 to substrate 440 (as opposed to a simple support, e.g., diagram 200B). Support region 470 may be mechanically fixed to the substrate 440 at a single surface. Again, second continuous region 485 is laterally spanning the perimeter 480 of the diaphragm of microelectromechanical device 410, and as can be seen here, microelectromechanical device 410 is not coupled to substrate 440 in the second continuous region 485 so that stress 155 is decoupled from microelectromechanical device 410.

Figure 5A:
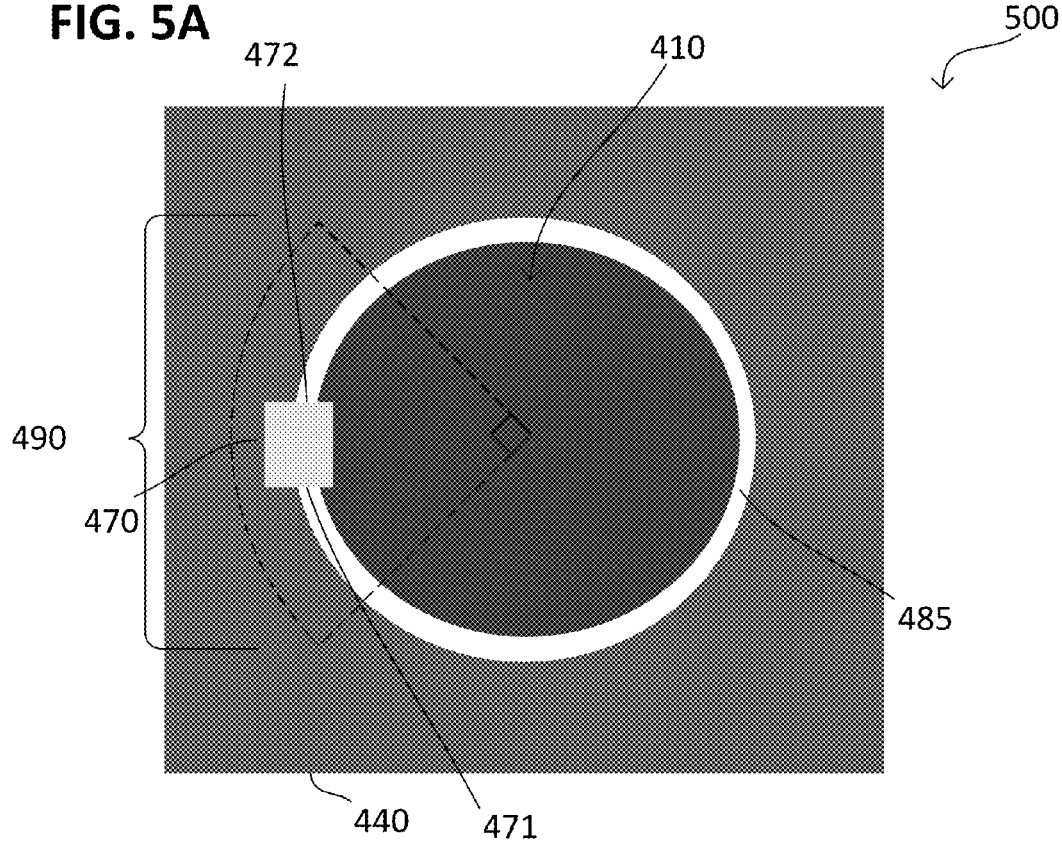
FIG. 5A shows a top view of a stress-decoupled microelectromechanical system.

FIG. 5A shows a top view of a microelectromechanical system 500. Microelectromechanical system 500 is similar to microelectromechanical system 400 and may include: substrate 440; microelectromechanical device 410 including: a diaphragm configured as a transducer to convert between electrical energy and mechanical energy and an electrode coupled to the diaphragm; a support region 470 mechanically coupling the microelectromechanical device 410 to the substrate 440, wherein the support region 470 is confined to a first continuous region 490 spanning an arc of less than 90 degrees around a perimeter 480 of the diaphragm; and a second continuous region 485 free from mechanical support of the microelectromechanical device 410 to the substrate 440, the second continuous region 485 spanning the perimeter 480 of the diaphragm from one end 471 of the support region to the other end 472 of the support region 470; wherein the support region 470 cantilevers the microelectromechanical device 410 and the second continuous region 485 mechanically decouples stress 155 from the microelectromechanical device 410 due to the substrate 440.

In an aspect of the disclosure, support region 470 may include at least one mechanical support structure 470 (also depicted here as support region 470). The at least one mechanical support structure 470 may further provide an electrical connection for the diaphragm of microelectromechanical device 410.

In an aspect of the disclosure, second continuous region 485 forms a gap configured as a ventilation path between the substrate 440 and the microelectromechanical device 410. The ventilation path formed by second continuous region 485 may define a uniform distance between the substrate 440 and the microelectromechanical device 410, e.g., 100 nm to 3 μm.

A ventilation path may provide a route for fluid flow (e.g., air) between a front and back side of a diaphragm, which may result in damping natural resonance of a diaphragm, provide a smooth frequency response, and allow environmental pressure to reach equilibrium on either side of a diaphragm. In an aspect of the disclosure, the ventilation path may thus be designed as narrow as may be required to reduce or increase ventilation and may, for example, provide less ventilation than a spring support due to multiple slots around a diaphragm.

Figure 5B:
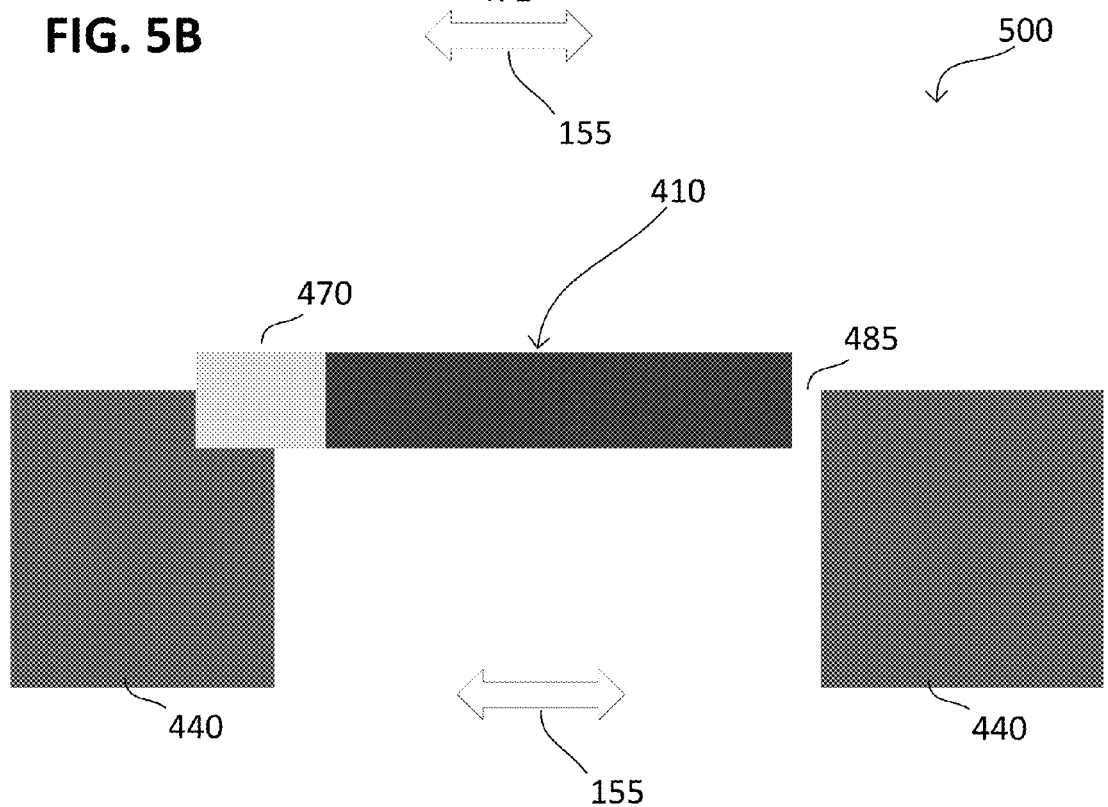
FIG. 5B shows a side view of a cross-section of a stress-decoupled microelectromechanical system.

FIG. 5B shows a side view of a cross-section of a microelectromechanical system 500. The microelectromechanical system 500 is the same as that described above in FIG. 5A. As may be seen from a cross-sectional side view, second continuous region 485 decouples microelectromechanical device 410 from substrate 440 which way laterally surround microelectromechanical device 410 and support region 470. Accordingly, as may also be seen here, stress 155 from substrate 440 is not coupled into microelectromechanical device 410.

Figure 6A:
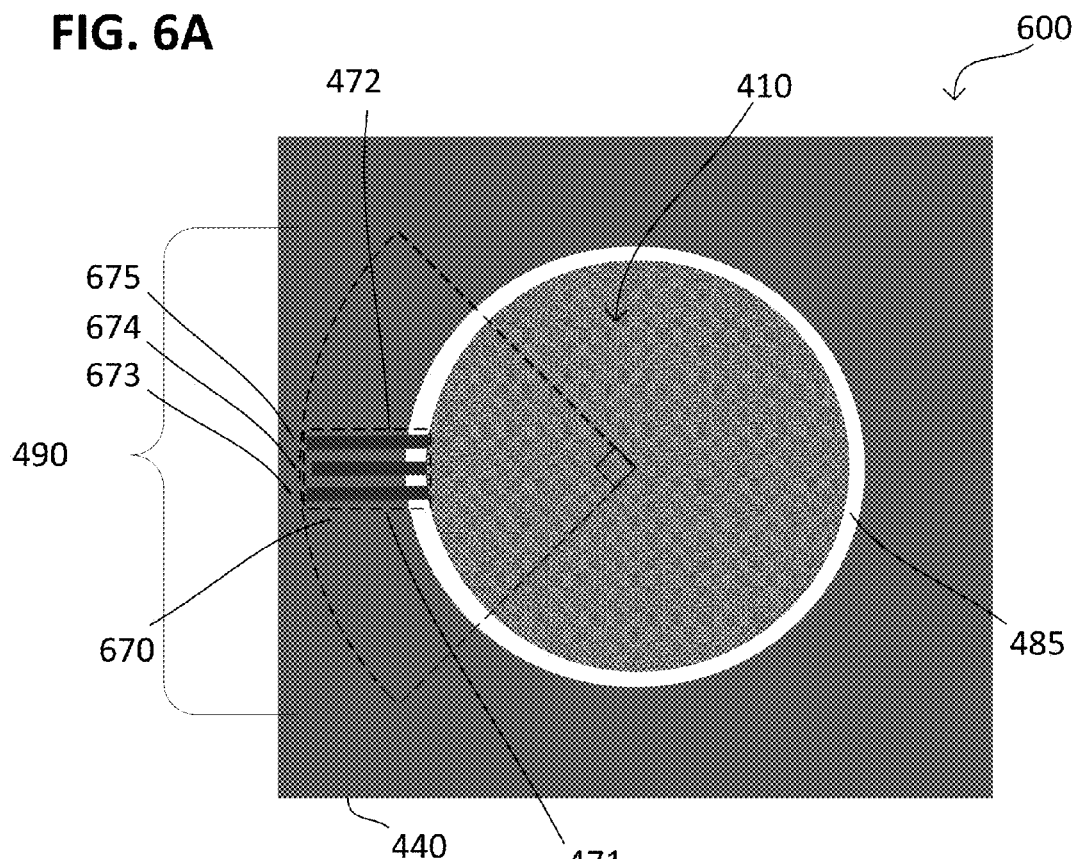
FIG. 6A shows a top view of a stress-decoupled microelectromechanical system.

FIG. 6A shows a top view of a microelectromechanical system 600. Microelectromechanical system 600 may be similar to microelectromechanical systems 400 and 500, and may include: substrate 440; microelectromechanical device 410 including: a diaphragm 630 (see FIG. 6B) configured as a transducer to convert between electrical energy and mechanical energy and an electrode 620 (see FIG. 6B) coupled to the diaphragm 630; a support region 670 mechanically coupling the microelectromechanical device 410 to the substrate 440, wherein the support region 670 is confined to a first continuous region 490 spanning an arc of less than 90 degrees around a perimeter 480 of the diaphragm 630; and a second continuous region 485 free from mechanical support of the microelectromechanical device 410 to the substrate 440, the second continuous region 485 spanning the perimeter 480 of the diaphragm 630 from one end 471 of the support region to the other end 472 of the support region 670; wherein the support region 670 cantilevers the microelectromechanical device 410 and the second continuous region 485 mechanically decouples stress 155 from the microelectromechanical device 410 due to the substrate 440.

In an aspect of the disclosure, a resonant frequency of the microelectromechanical device 410 and the support region 470 may be greater than an operational frequency (e.g., greater than 20 kHz) of microelectromechanical device 410 (including electrode 620 and diaphragm 630).

In an aspect of the disclosure, support region 670 may include a crystalline material such as, e.g., silicon (e.g., bulk silicon, polycrystalline silicon, nanocrystalline silicon). Support region 670 may include a dielectric material, such as a silicon-oxide, e.g., $SiO_2$. Support region 670 may include a polymer. Support region 670 may include a polyimide (e.g., SO8), which may require a thicker support structure due to stiffness. Support region 670 may include a metal, which may have insulated contacts. Support region 670 may be formed in a sandwich-structure, which may include embedded conductive paths formed from an electrically conductive material. Support region 670 may be manufactured with a laminate technology, e.g., manufactured by depositing multiple layers.

In an aspect of the disclosure, support region 670 may include a plurality of mechanical support structures, e.g., 1-5, e.g., 3. As can be seen, the support region 670 is itself confined to the first continuous region 490, but within the first continuous region 490 may include discrete structures, e.g., mechanical support structures. A first structure 673 of the plurality of mechanical support structures of support region 670 may further provide an electrical connection to diaphragm 630. A second structure 674 of the plurality of mechanical support structures of support region 670 may further provide an electrical connection to electrode 620. A third structure 675 of the plurality of mechanical support structures of support region 670 may further provide an electrical connection to a further electrode (not depicted here).

Figure 6B:
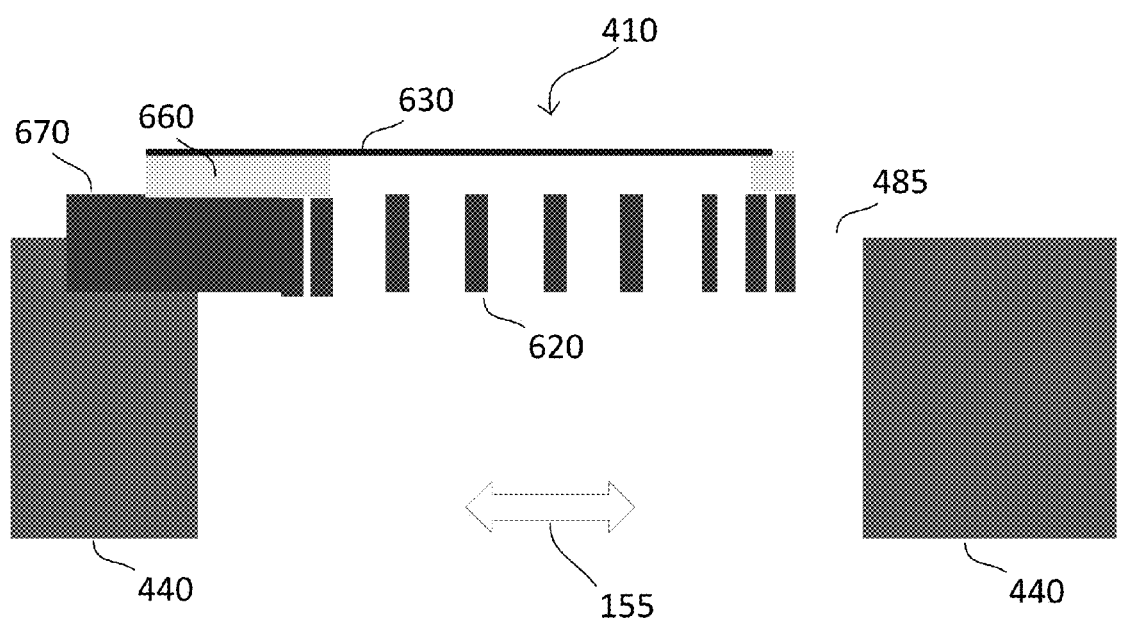
FIG. 6B shows a side view of a cross-section of a stress-decoupled microelectromechanical system.

FIG. 6B shows a side view of a cross-section of a microelectromechanical system 600. The microelectromechanical system 600 is the same as that described above in FIG. 6A. In an aspect of the disclosure the support region 670 and the electrode 620 may be a single construction (e.g., a single structure, i.e., formed of a single body) that supports the diaphragm 630. Dielectric material 660 may be disposed between diaphragm 630 and electrode 620. As depicted above, in FIG. 6A, if the support region 670 includes more than one mechanical support structure, at least one of the mechanical support structures may be insulated from electrode 620 and electrically connected to diaphragm 630.

As may also be readily seen in the cross-sectional side view of microelectromechanical system 600, second continuous region 485 (configured as a ventilation path) may decouple stress 155 due to substrate 440 from microelectromechanical device 410, e.g., from diaphragm 430 and electrode 620.

Electrode 620 may include an electrically conductive material. In addition, electrode 620 may be located at a predefined distance from a first side of diaphragm 630 and may be substantially parallel to the diaphragm 630. Electrode 620 and diaphragm 630 may be configured to have an electrically capacitive relationship.

In an aspect of the disclosure, diaphragm 630 may include an electrically conductive material, e.g., metal or silicon, e.g., doped silicon.

Diaphragm 630 may be configured to actuate by a mechanical interaction, an electric field interaction, or a magnetic field interaction, or any combination thereof. Electrode 620 may provide the electric field interaction, the magnetic field interaction, or any combination thereof. Alternatively, electrode 620 may provide an electrical signal in response to an actuation of diaphragm 630.

FIG. 7A shows a top view of a microelectromechanical system 700A.

Microelectromechanical system 700A may be similar to microelectromechanical systems 400, 500, and 600, and may include: substrate 440; microelectromechanical device 410 including: a diaphragm 630 (see FIG. 6B) configured as a transducer to convert between electrical energy and mechanical energy and an electrode 620 (see FIG. 6B) coupled to the diaphragm 630; a support region 670 mechanically coupling the microelectromechanical device 410 to the substrate 440, wherein the support region 670 is confined to a first continuous region 490 spanning an arc of less than 90 degrees around a perimeter 480 of the diaphragm 630; and a second continuous region 485 free from mechanical support of the microelectromechanical device 410 to the substrate 440, the second continuous region 485 spanning the perimeter 480 of the diaphragm 630 from one end 471 of the support region to the other end 472 of the support region 670; wherein the support region 670 cantilevers the microelectromechanical device 410 and the second continuous region 485 mechanically decouples stress 155 from the microelectromechanical device 410 due to the substrate 440. In an aspect of the disclosure, microelectromechanical device 410 may be substantially circular in form and support region 670 may be minimized to reduce stress 155 due to the substrate 440 in microelectromechanical device 410.

FIG. 7B shows a top view of a microelectromechanical system 700B. Microelectromechanical system 700B may be similar to microelectromechanical systems 400, 500, 600, and 700A, and may include: substrate 440; microelectromechanical device 410 including: a diaphragm 630 (see FIG. 6B) configured as a transducer to convert between electrical energy and mechanical energy and an electrode 620 (see FIG. 6B) coupled to the diaphragm 630; a support region 670 mechanically coupling the microelectromechanical device 410 to the substrate 440, wherein the support region 670 is confined to a first continuous region 490 spanning an arc of less than 90 degrees around a perimeter 480 of the diaphragm 630; and a second continuous region 485 free from mechanical support of the microelectromechanical device 410 to the substrate 440, the second continuous region 485 spanning the perimeter 480 of the diaphragm 630 from one end 471 of the support region to the other end 472 of the support region 670; wherein the support region 670 cantilevers the microelectromechanical device 410 and the second continuous region 485 mechanically decouples stress 155 from the microelectromechanical device 410 due to the substrate 440. In an aspect of the disclosure, microelectromechanical device 410 may be substantially rectangular, e.g., a square, in form and support region 470 may extend along one side of microelectromechanical device 410.

FIG. 8 shows a method 800 for manufacturing a microelectromechanical system. Method 800 may include providing a substrate 810; providing a microelectromechanical device including: a diaphragm configured as a transducer to convert between electrical energy and mechanical energy and an electrode coupled to the diaphragm 820, providing a support region mechanically coupling the microelectromechanical device to the substrate, wherein the support region is confined to a first continuous region spanning an arc of less than 90 degrees around a perimeter of the diaphragm 830; and providing a second continuous region free from mechanical support of the microelectromechanical device to the substrate, the second continuous region spanning the perimeter of the diaphragm from one end of the support region to the other end of the support region 840; wherein the support region cantilevers the microelectromechanical device and the second continuous region mechanically decouples the microelectromechanical device from the substrate.

In an aspect of the disclosure of method 800, the support region may mechanically fix the microelectromechanical device to the substrate. The support region and the electrode may be formed in a single construction that supports the diaphragm. The support region may include at least one support structure. The at least one mechanical support structure may provide an electrical connection to the diaphragm. A resonant frequency of the microelectromechanical device and the support region may be greater than an operational frequency of the microelectromechanical device.

In an aspect of the disclosure of method 800, support region 670 may include a crystalline material such as, e.g., silicon (e.g., bulk silicon, polycrystalline silicon, nanocrystalline silicon). Support region 670 may include a dielectric material, such as a silicon-oxide, e.g., $SiO_2$. Support region 670 may include a polymer. Support region 670 may include a polyimide (e.g., SO8), which may require a thicker support structure due to stiffness. Support region 670 may include a metal, which may have insulated contacts. Support region 670 may be formed in a sandwich-structure, which may include embedded conductive paths formed from an electrically conductive material. Support region 670 may be manufactured with a laminate technology, e.g., manufactured by depositing multiple layers, e.g., depositing a dielectric material over a substrate, depositing an electrically conductive material over the dielectric material, and depositing another dielectric material over the electrically conductive material to form a sandwich-structure. The electrically conductive material, which may, for example, provide an electrical connection via the support region to the diaphragm 630, may thus be insulated by the dielectric material.

In an aspect of the disclosure of method 800, providing the support region may further include structuring the support region to include at least one mechanical support structure. Structuring the support region may include forming a plurality of mechanical support structures, e.g., three mechanical support structures.

In an aspect of the disclosure of method 800, the support region may include a plurality of mechanical support structures, e.g., three mechanical support structures. A first structure of the plurality of mechanical support structures may further provide an electrical connection to the diaphragm. A second structure of the plurality of mechanical support structures may further provide an electrical connection to the electrode. A third structure of the plurality of mechanical support structures may further provide an electrical connection to a further electrode.

In an aspect of the disclosure of method 800, the second continuous gap may be configured as a ventilation path between the substrate and the microelectromechanical device. The ventilation path may define a uniform distance between the substrate and the microelectromechanical device.

In an aspect of the disclosure of method 800, the microelectromechanical system may be embedded in an encapsulant. Alternatively or additionally, the microelectromechanical system may be mounted on a layer. The layer may include an insulator and at least one conductive path. The conductive path may include an electrically conductive material.

In an aspect of the disclosure of method 800, the electrode may include an electrically conductive material. The electrode may have a plurality of holes penetrating a thickness of the electrode. In addition, the electrode may have a plurality of protrusions configured to prevent static friction (stiction) to the diaphragm. The electrode may be a predefined distance from the diaphragm and may be configured to have an electrically capacitive relationship to the diaphragm. The electrode may be located on a first side of the diaphragm and may be substantially parallel to the diaphragm.

In an aspect of the disclosure of method 800, the microelectromechanical system may include a further electrode coupled to the diaphragm, which may be located on a second side of the diaphragm (opposite the first side), and may be substantially parallel to the diaphragm. The further electrode may have a plurality of holes penetrating a thickness of the further electrode. In addition, the further electrode may have a plurality of protrusions configured to prevent static friction (stiction) to the diaphragm. The further electrode and the diaphragm may be configured to have an electrically capacitive relationship.

In an aspect of the disclosure of method 800, the diaphragm may include a corrugated region. In addition, the diaphragm may include a plurality of protrusion configured to prevent static friction (stiction) to at least one of the electrode and the further electrode.

In an aspect of the disclosure of method 800, diaphragm 630 may include an electrically conductive material, e.g., metal or silicon, e.g., doped silicon.

In an aspect of the disclosure of method 800, the diaphragm may be configured to actuate due to a mechanical interaction, an electric field interaction, or a magnetic field interaction, or any combination thereof. The electrode may provide the electrical field interaction or the magnetic field interaction, or any combination thereof. Alternatively, the electrode may provide an electrical signal in response to an actuation of the diaphragm. The diaphragm may be further actuated by a further electric field interaction or a further magnetic field interaction, or any combination thereof. The further electrode may provide a further electric field interaction or the further magnetic field interaction, or any combination thereof. Alternatively, the further electrode may provide a further electrical signal in response to an actuation of the diaphragm.

In an aspect of the disclosure of method 800, the microelectromechanical system may further include an electronic circuit. The electronic circuit may receive an electrical signal from the electrode. The electronic circuit may be configured to convert the electrical signal (an analog electrical input) into a digital signal (digital output). The electronic circuit may further receive a further electrical signal from the further electrode and convert the further electrical signal into a further digital signal. The digital signal and the further digital signal may be combined by the electronic circuit.

In an aspect of the disclosure of method 800, the substrate may include a semiconductor. The substrate may include a dielectric material.

FIG. 9A-9F show, in cross-section, a method for manufacturing a microelectromechanical device for a microelectromechanical system.

Figure 9A:
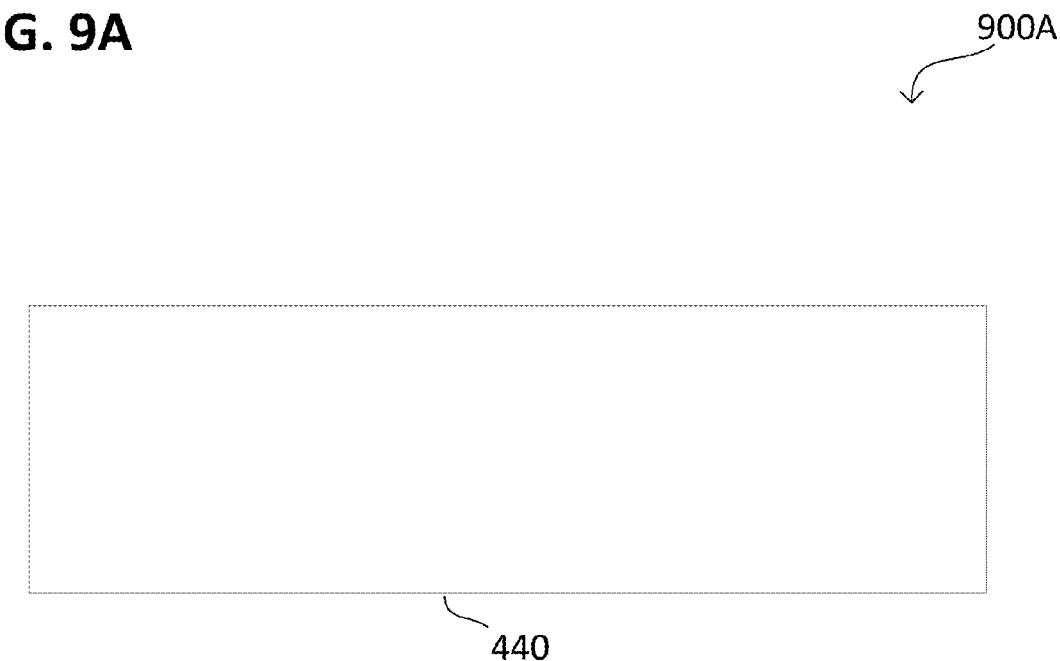
FIG. 9A-9F show, in cross-section, a method for manufacturing a microelectromechanical system.
Figure 9B:
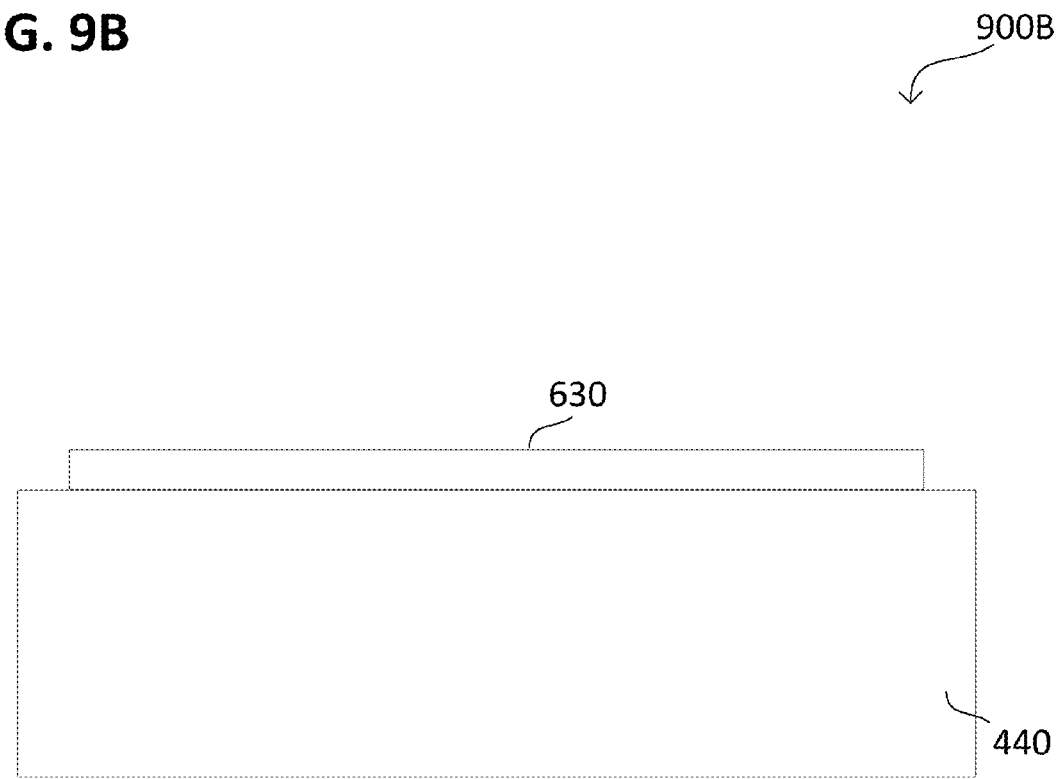

In FIG. 9A, a substrate 440 may be provided. Providing the microelectromechanical device 810 (e.g., microelectromechanical device 410), as depicted in FIG. 9B may include: forming a first electrically conductive layer 630, e.g., a diaphragm, over the substrate 440 and structuring the first electrically conductive layer 630. Structuring the first electrically conductive layer 630 may include forming a corrugated region in the first electrically conductive layer 630, e.g., forming a plurality of protrusions on the first electrically conductive layer 630, (not depicted here, see FIG. 10A). The corrugated region may include concentric protrusions.

Figure 9C:
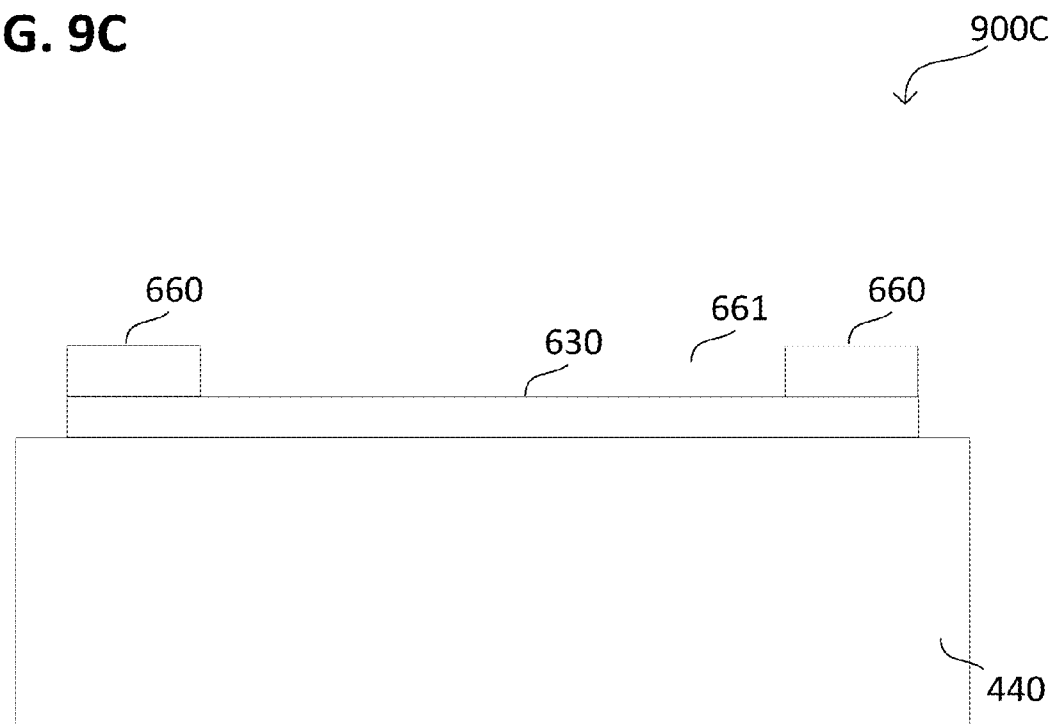

In FIG. 9C, forming a dielectric layer 660 over the substrate may be depicted. Forming a dielectric layer 660 may further include structuring the dielectric layer 660, e.g., forming a recess 661 in the dielectric layer 660.

Figure 9D:
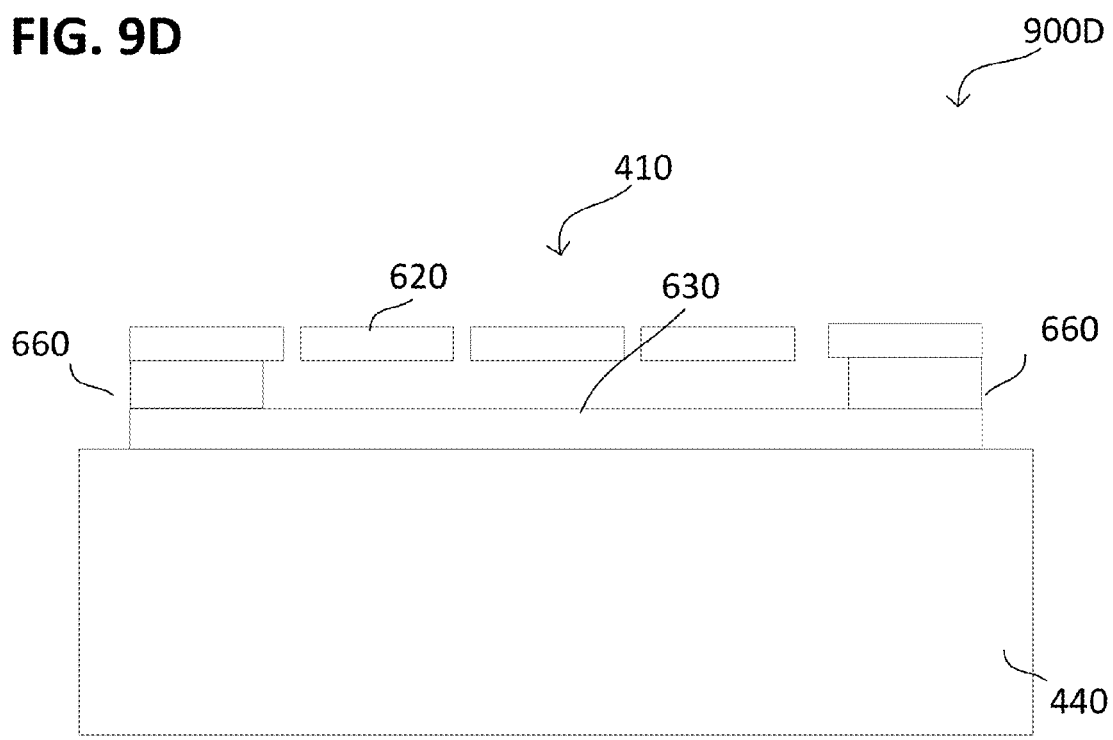

Forming a second electrically conductive layer 620, e.g., an electrode, over the substrate 440 may be depicted in FIG. 9D to form a microelectromechanical device 410. Second electrically conductive layer 620 may be structured to form a plurality of holes penetrating a thickness of the second electrically conductive layer. In addition, a plurality of protrusions may be formed on the second electrically conductive layer, which may be configured to prevent static friction (stiction) to other components. Structuring the second electrically conductive layer may further include forming support region 670 (not depicted here).

Figure 9E:
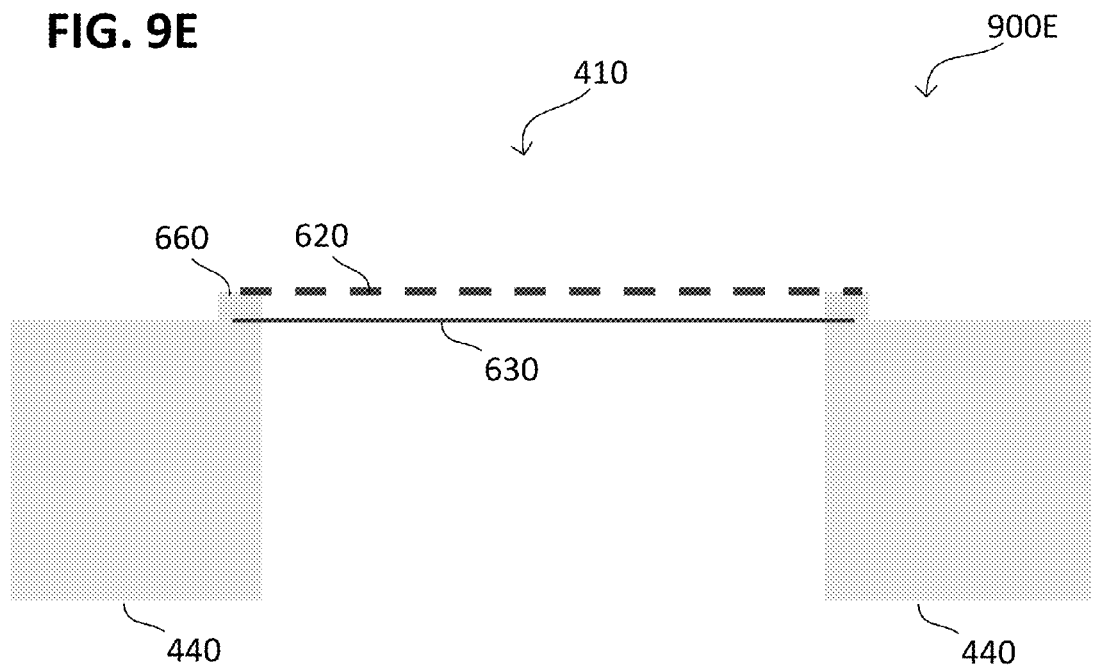
Figure 9F:
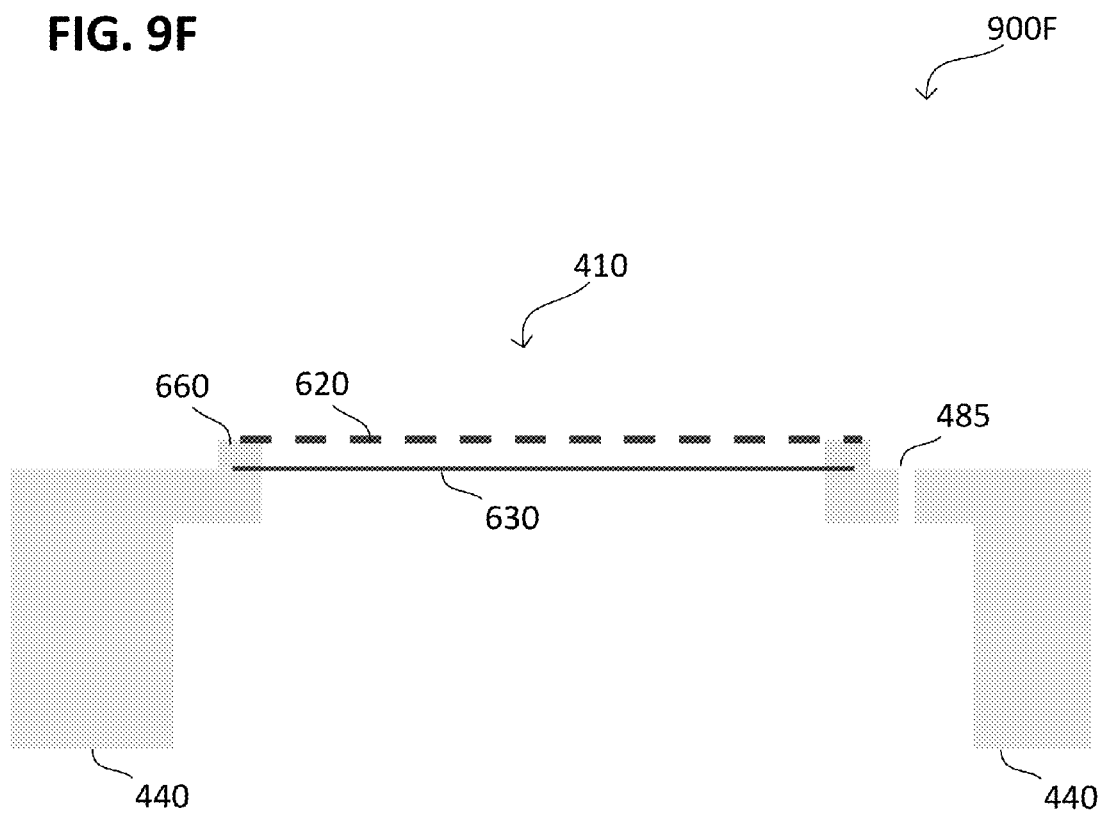

FIG. 9E may depict removing a portion of the substrate 440 to expose a side of the first electrically conductive layer, e.g., a diaphragm, formed on the substrate 440. FIG. 9F may depict removing a further portion of the substrate 440 (e.g., forming a trench in substrate 440) along the perimeter of the microelectromechanical device 410 to form second continuous region 485 (which may be configured as a ventilation path). The initial portion removed in FIG. 9E may be widened to expose second continuous region 485.

Figure 10A:
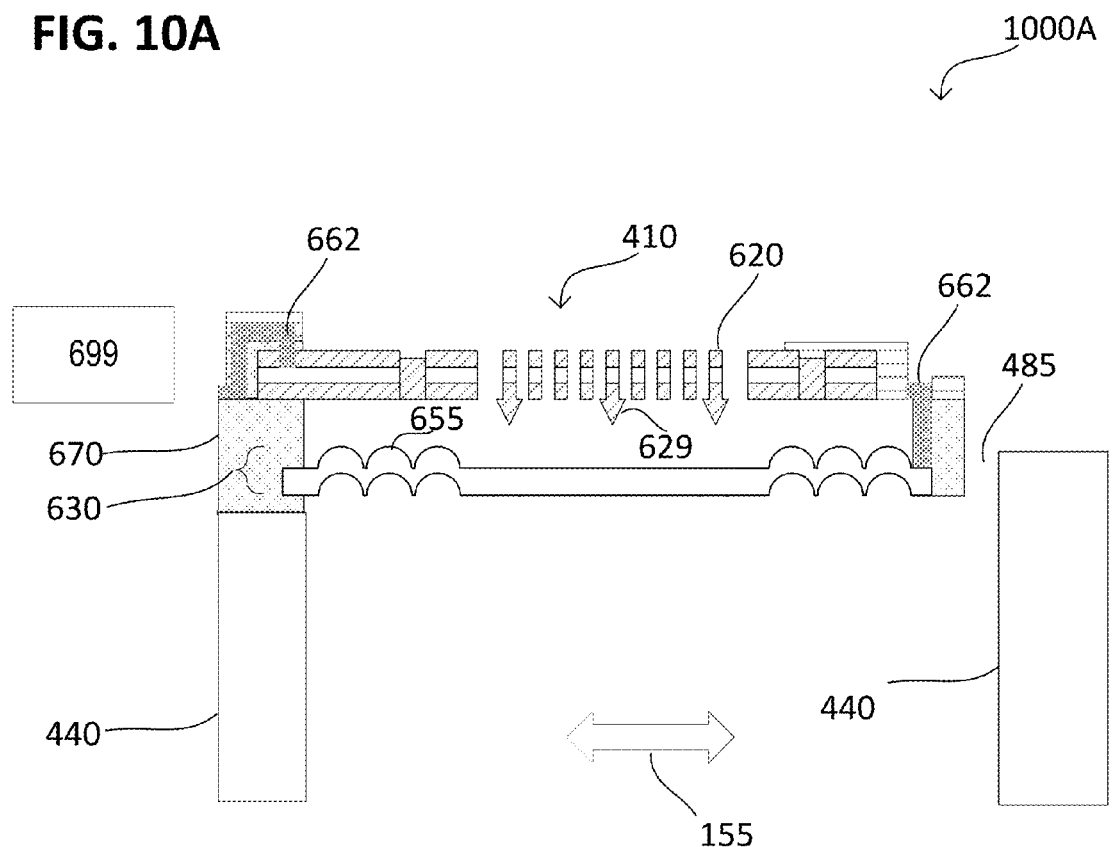
FIG. 10A shows a side view of a cross-section of a stress-decoupled microelectromechanical system.

FIG. 10A shows a side view of a cross-section of a microelectromechanical system 1000A. Microelectromechanical system 1000A may be similar to microelectromechanical systems 400, 500, 600, and 700A, and may include: substrate 440; microelectromechanical device 410 including: a diaphragm 630 configured as a transducer to convert between electrical energy and mechanical energy and an electrode 620 coupled to the diaphragm 630; a support region 670 mechanically coupling the microelectromechanical device 410 to the substrate 440, wherein the support region 670 is confined to a first continuous region 490 spanning an arc of less than 90 degrees around a perimeter 480 of the diaphragm 630; and a second continuous region 485 free from mechanical support of the microelectromechanical device 410 to the substrate 440, the second continuous region 485 spanning the perimeter 480 of the diaphragm 630 from one end 471 of the support region to the other end 472 of the support region 670; wherein the support region 670 cantilevers the microelectromechanical device 410 and the second continuous region 485 mechanically decouples stress 155 from the microelectromechanical device 410 due to the substrate 440.

In an aspect of the disclosure, electrode 620 may include protrusions 629 configured to prevent static friction (stiction) to diaphragm 630. Diaphragm 630 may include corrugated regions 655, which may be concentric protrusions.

Microelectromechanical system 1000A may be a MEMS, such as a transducer, or a microphone, including microelectromechanical device 410. Diaphragm 630 may be configured to actuate. Electrode 620 may be configured to at least one of: provide a force to actuate the diaphragm 630 in response to an electrical signal transmitted to the electrode 620 and provide an electrical signal in response to an actuation of the diaphragm 630.

For example, in an aspect of the disclosure, the microelectromechanical system 1000A may be a MEMS microphone and a force, e.g., a pressure gradient, such as a mechanical wave (including a sound wave, as well as non-auditory mechanical waves or impulses), external fluid pressure (external from the component, including, for example, gauge pressure) may cause diaphragm 630 to actuate, or move, in relation to the magnitude of the force impinging the diaphragm 630. Diaphragm 630 may have, for example, a capacitive relationship with electrode 620. Actuation of diaphragm 630 may then change an electrically capacitive relationship, e.g., the magnitude of the capacitance, between, for example, diaphragm 630 and electrode 620, thus an electrical signal may be produced in electrode 620; for example, this change in capacitance may occur and be detected by electronic circuit 699 connected to the electrode 620 and/or diaphragm 630 (such circuitry 699, which may, for example, be external to the microelectromechanical system or may be integrated with the microelectromechanical system and may be electrically contacted to contacts 662).

Diaphragm 630 may be biased by an external voltage, i.e., provided with a voltage, e.g., contacted at contact 462 for the diaphragm 630, such as in a condenser microphone, or diaphragm 630 may, for example, maintain an embedded static electrical charge, such as in an electret microphone.

Alternatively or additionally, electrode 620 may provide a force to actuate the diaphragm 630 in response to an electrical signal transmitted to the electrode 620. For example, the electrical signal may provide a voltage to electrode 620, which may provide an electric field interaction or magnetic field interaction on diaphragm 630 (e.g., exert an electric force) causing diaphragm 630 to actuate. This actuation may produce a mechanical wave, e.g., a sound wave, thus allowing microelectromechanical system 1000A to operate as a speaker.

Figure 10B:
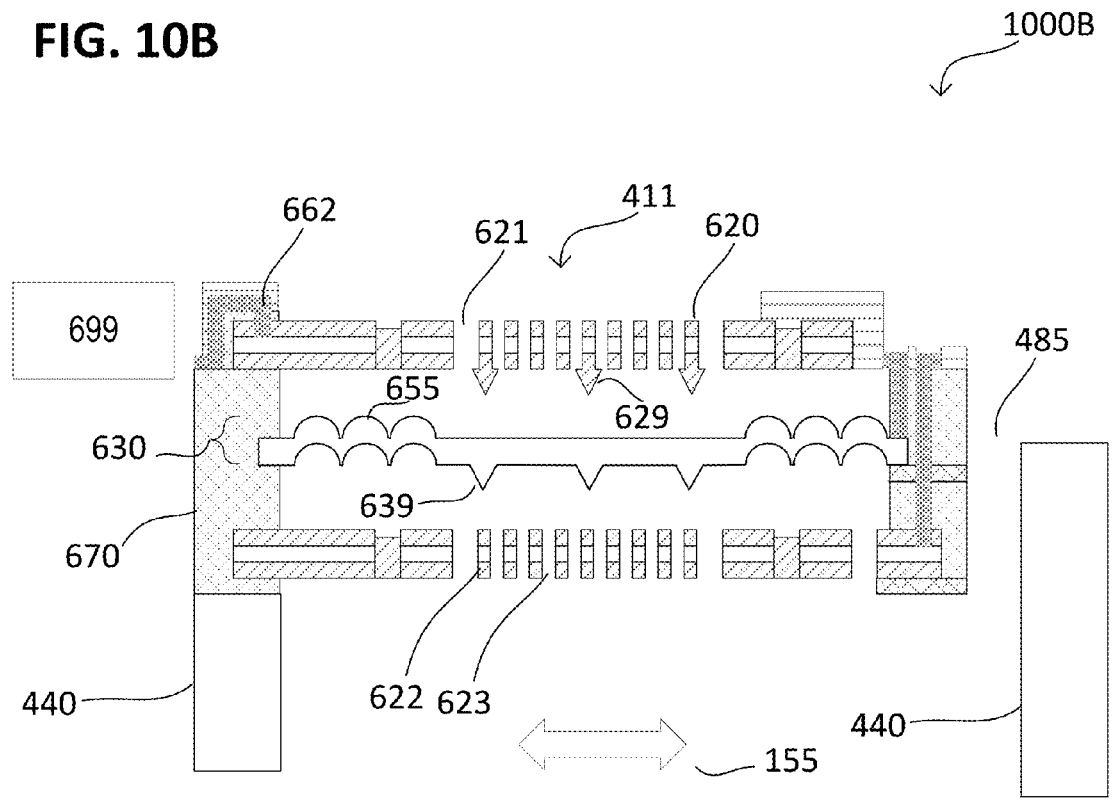
FIG. 10B shows a side view of a cross-section of a stress-decoupled microelectromechanical system.

FIG. 10B shows a side view of a cross-section of a microelectromechanical system 1000B. Microelectromechanical system 1000B may be similar to microelectromechanical systems 400, 500, 600, 700A and 1000A, and may additionally include further electrode 622 coupled to diaphragm 630.

Further electrode 622 may be located on a second side of the diaphragm, opposite the first side, and may be substantially parallel to the diaphragm 630. The further electrode may have a plurality of holes 623 penetrating a thickness of the further electrode 622. Further electrode 622 may be configured to have an electrically capacitive relationship with diaphragm 630.

Electronic circuit 699 may receive the further electrical signal from the further electrode and convert the further electrical signal into a further digital signal, which may be combined with the digital signal by electronic circuit 699.

The diaphragm 630 may be further actuated by a further electric field interaction or a further magnetic field interaction, or any combination thereof. The further electrode 622 may provide the further magnetic field interaction or the further magnetic field interaction, or any combination thereof. Alternatively, the further electrode may provide a further electrical signal in response to an actuation of diaphragm 630.

A dual-backplate (DBP) arrangement for a MEMS microphone may be advantageous, e.g., electrode 620 and further electrode 622 may form dual backplates for diaphragm 630. As the MEMS microphone may have two backplates, sensitivity of the component may be increased due to the presence of two electrodes, or even more accurate measurement (or detection) by providing a second electrode. Sensitivity of the component may also be increased as the dual backplates allow for higher bias voltages, which may exert similar (or cancelling) electrostatic forces on, e.g., diaphragm 630, which may reduce effects of pull-in (diaphragm attraction to an electrode due to electrostatic forces, which may lead to, e.g., diaphragm collapse).

Additionally, a diaphragm 630 having a corrugated region 655 may increase bandwidth and sensitivity of the component, e.g., due to increased compliance of the diaphragm 630. The rounded, or smoothed out, transitions of corrugated region 655 avoid concentrations of internal stress, e.g., in an angular edge of diaphragm corrugation, when diaphragm 630 is actuated, which may, e.g., lead to component failure or inaccurate measurement.

In an aspect of the disclosure, Example 1 may be a microelectromechanical system including: a substrate; a microelectromechanical device including: a diaphragm configured as a transducer to convert between electrical energy and mechanical energy and an electrode coupled to the diaphragm; a support region mechanically coupling the microelectromechanical device to the substrate, wherein the support region is confined to a first continuous region spanning an arc of less than 90 degrees around a perimeter of the diaphragm; and a second continuous region free from mechanical support of the microelectromechanical device to the substrate, the second continuous region spanning the perimeter of the diaphragm from one end of the support region to the other end of the support region; wherein the support region cantilevers the microelectromechanical device and the second continuous region mechanically decouples the microelectromechanical device from the substrate.

Example 2 may include Example 1, wherein the support region mechanically fixes the microelectromechanical device to the substrate.

Example 3 may include any one of Examples 1 and 2, wherein a resonant frequency of the microelectromechanical device and the support region is greater than an operational frequency of the microelectromechanical device.

Example 4 may include any one of Examples 1-3, wherein the support region further provides an electrical connection to the diaphragm.

Example 5 may include any one of Examples 1-4, wherein the support region and the electrode are a single construction that supports the diaphragm.

Example 6 may include any one of Examples 1-5, wherein the support region includes at least one mechanical support structure.

Example 7 may include any one of Examples 1-5, wherein the support region includes a plurality of mechanical support structures.

Example 8 may include Example 7, wherein a first structure of the plurality of mechanical support structures further provides an electrical connection to the diaphragm.

Example 9 may include any one of Examples 7 and 8, wherein a second structure of the plurality of mechanical support structures further provides an electrical connection to the electrode.

Example 10 may include any one of Examples 7-9, wherein a third structure of the plurality of mechanical support structures further provides an electrical connection to a further electrode.

Example 11 may include any one of Examples 1-3, wherein the support region includes three mechanical support structures.

Example 12 may include any one of Examples 1-11, wherein the second continuous region forms a gap configured as a ventilation path between the substrate and the microelectromechanical device.

Example 13 may include Example 12, wherein the ventilation path defines a uniform distance between the substrate and the microelectromechanical device.

Example 14 may include any one of Examples 1-13, wherein the substrate includes a semiconductor.

Example 15 may include any one of Examples 1-13, wherein the microelectromechanical system is embedded an encapsulant.

Example 16 may include any one of Examples 1-13, wherein the microelectromechanical device is mounted on a layer.

Example 17 may include Example 16, wherein the layer includes an insulator and at least one conductive path.

Example 18 may include Example 17, wherein the at least one conductive path includes an electrically conductive material.

Example 19 may include any one of Examples 1-18, wherein the electrode includes an electrically conductive material.

Example 20 may include any one of Examples 1-19, wherein the electrode has a plurality of holes penetrating a thickness of the electrode.

Example 21 may include any one of Examples 1-20, wherein the electrode has a plurality of protrusions configured to prevent static friction to the diaphragm.

Example 22 may include any one of Examples 1-21, wherein the electrode is a predefined distance from the diaphragm.

Example 23 may include any one of Examples 1-22, wherein the electrode and the diaphragm are configured to have an electrically capacitive relationship.

Example 24 may include any one of Examples 1-23, wherein the electrode is located on a first side of the diaphragm and is substantially parallel to the diaphragm.

Example 25 may include any one of Examples 1-24, further including: a further electrode coupled to the diaphragm.

Example 26 may include Example 25, wherein the further electrode is located on a second side of the diaphragm, opposite the first side, and is substantially parallel to the diaphragm.

Example 27 may include any one of Examples 25 and 26, wherein the further electrode has a plurality of holes penetrating a thickness of the further electrode.

Example 28 may include any one of Examples 25-27, wherein the further electrode has a plurality of protrusions configured to prevent static friction to the diaphragm.

Example 29 may include any one of Examples 25-28, wherein the further electrode and the diaphragm are configured to have an electrically capacitive relationship.

Example 30 may include any one of Examples 1-29, wherein the diaphragm includes a corrugated region.

Example 31 may include any one of Examples 1-30, wherein the diaphragm has a plurality of protrusions configured to prevent static friction to at least one of the electrode and a further electrode.

Example 32 may include any one of Examples 1-31, wherein the support region includes a crystalline material.

Example 33 may include any one of Examples 1-32, wherein the support region includes silicon.

Example 34 may include Example 33, wherein the silicon is bulk silicon.

Example 35 may include Example 33, wherein the silicon is polycrystalline silicon.

Example 36 may include any one of Examples 1-35, wherein the support region includes a dielectric material.

Example 37 may include Example 36, wherein the dielectric material is a silicon oxide.

Example 38 may include any one of Examples 1-37, wherein the support region includes a polymer.

Example 39 may include any one of Examples 1-38, wherein the support region includes a polyimide.

Example 40 may include any one of Examples 1-39, wherein the support region includes a metal.

Example 41 may include any one of Examples 1-40, wherein the diaphragm is configured to actuate.

Example 42 may include Example 41, wherein the diaphragm is actuated by a mechanical interaction, an electric field interaction, or a magnetic field interaction, or any combination thereof.

Example 43 may include Example 42, wherein the electrode provides the electric field interaction or the magnetic field interaction, or any combination thereof.

Example 44 may include Example 41, wherein the electrode provides an electrical signal in response to an actuation of the diaphragm.

Example 45 may include Example 42, wherein the diaphragm is further actuated by a further electric field interaction or a further magnetic field interaction, or any combination thereof.

Example 46 may include Example 45, wherein the further electrode provides the further electric field interaction or the further magnetic field interaction, or any combination thereof.

Example 47 may include Example 42, wherein the further electrode provides a further electrical signal in response to an actuation of the diaphragm.

Example 48 may include any one of Examples 1-47, further including: an electronic circuit.

Example 49 may include Example 48, wherein the electronic circuit receives the electrical signal from the electrode.

Example 50 may include Example 49, wherein the electronic circuit is configured to convert the electrical signal into a digital signal.

Example 51 may include Example 48, wherein the electronic circuit further receives the further electrical signal from the further electrode.

Example 52 may include Example 51, wherein the electronic circuit is configured to convert the further electrical signal into a further digital signal.

Example 53 may include Example 1, wherein the support region mechanically fixes the microelectromechanical device to the substrate.

Example 54 may include any one of Examples 1 and 53, wherein the microelectromechanical device and the support region are configured to have a resonant frequency greater than an operational frequency of the microelectromechanical device.

Example 55 may include any one of Examples 1, 53, and 54, wherein the support region further comprises a conductive path coupled with the diaphragm.

Example 56 may include any one of the Examples 1 and 53-55, wherein the support region further comprises a conductive path coupled with the electrode.

Example 57 may include any one of the Examples 1 and 53-56, wherein the support region comprises at least one mechanical support structure.

Example 58 may include Example 57, wherein the at least one mechanical support structure is integrally formed with the electrode and is configured as a frame for the diaphragm.

Example 59 may include Example 57, wherein one end of the at least one mechanical support is located outside of the first continuous region.

Example 60 may include any one of the Examples 1 and 53-59, wherein the second continuous region forms a gap configured as a ventilation path between the substrate and the microelectromechanical device.

Example 61 may include Example 60, wherein the ventilation path defines a uniform distance between the substrate and the microelectromechanical device.

Example 62 may include Example 61, wherein the uniform distance is between 3 nm and 3,000 nm.

Example 63 may include any one of Examples 1 and 53-62, wherein the diaphragm is free from at least one hole that penetrates a thickness of the diaphragm.

Example 64 may include any one of the Examples 1 and 53-63, wherein the diaphragm is configured to be actuated by at least one of the interactions selected from a group consisting of: a mechanical interaction; an electric field interaction; and a magnetic field interaction.

Example 65 may include any one of Examples 1 and 53-64, further comprising: an electronic circuit electrically coupled with the microelectromechanical device configured to output a digital signal corresponding to a voltage across the electrode and the diaphragm.

In an aspect of the disclosure, Example 66 may be a method for manufacturing a microelectromechanical system including: providing a substrate; providing a microelectromechanical device including: a diaphragm configured as a transducer to convert between electrical energy and mechanical energy and an electrode coupled to the diaphragm; providing a support region mechanically coupling the microelectromechanical device to the substrate, wherein the support region is confined to a first continuous region spanning an arc of less than 90 degrees around a perimeter of the diaphragm; and providing a second continuous region free from mechanical support of the microelectromechanical device to the substrate, the second continuous region spanning the perimeter of the diaphragm from one end of the support region to the other end of the support region; wherein the support region cantilevers the microelectromechanical device and the second continuous region mechanically decouples the microelectromechanical device from the substrate.

Example 67 may include Example 66, wherein providing the microelectromechanical device further includes: forming a first electrically conductive layer over the substrate.

Example 68 may include Example 67, wherein providing the microelectromechanical device further includes: structuring the first electrically conductive layer.

Example 69 may include Example 68, wherein structuring the first electrically conductive layer includes: forming a corrugated region in the first electrically conductive layer.

Example 70 may include Example 69, wherein the corrugated region includes concentric protrusions.

Example 71 may include Example 68, wherein structuring the first electrically conductive layer includes: forming a plurality of protrusions on the first electrically conductive layer.

Example 72 may include any one of Examples 67-71, wherein the first electrically conductive layer is the diaphragm.

Example 73 may include Example 67, wherein providing the microelectromechanical device further includes: forming a dielectric layer over the substrate.

Example 74 may include Example 72, wherein providing the microelectromechanical device further includes: structuring the dielectric layer.

Example 75 may include Example 74, wherein structuring the dielectric layer further includes: forming a recess in the dielectric layer.

Example 76 may include Example 67, wherein providing the microelectromechanical device further includes: forming a second electrically conductive layer over the substrate.

Example 77 may include Example 76, wherein providing the microelectromechanical device further includes: structuring the second electrically conductive layer.

Example 78 may include Example 77, wherein structuring the second electrically conductive layer further includes: forming a plurality of holes penetrating a thickness of the second electrically conductive layer.

Example 79 may include Example 77, wherein structuring the second electrically conductive layer further includes: forming a plurality of protrusions on the second electrically conductive layer.

Example 80 may include any one of Examples 76-79, wherein the second electrically conductive layer is the electrode.

Example 81 may include any one of Examples 76 and 80, wherein forming the second electrically conductive layer further includes forming the support region.

Example 82 may include Example 67, wherein providing the microelectromechanical device further includes: removing a portion of the substrate to expose a side of the first electrically conductive layer formed on the substrate.

Example 83 may include any one of Examples 66-82, wherein providing the support region further includes: structuring the support region.

Example 84 may include Example 83, wherein structuring the support region further includes: forming at least one mechanical support structure.

Example 85 may include Example 83, wherein structuring the support region further includes: forming a plurality of mechanical support structures.

Example 86 may include Example 83, wherein structuring the support region further includes: forming three mechanical support structures.

Example 87 may include any one of Examples 66-86, wherein providing the second continuous region further includes: removing a further portion of the substrate along the perimeter of the microelectromechanical device.

Example 88 may include any one of Examples 66-87, wherein providing the second continuous region further includes: forming a ventilation path along the perimeter of the microelectromechanical device.

Example 89 may include any one of Examples 66-88, wherein providing the second continuous region further includes: forming a trench along the perimeter of the microelectromechanical device.

Example 90 may include any one of Examples 66-89, wherein the support region mechanically fixes the microelectromechanical device to the substrate.

Example 91 may include any one of Examples 66-90, wherein a resonant frequency of the microelectromechanical device and the support region is greater than an operational frequency of the microelectromechanical device.

Example 92 may include Example 66, wherein the support region further provides an electrical connection to the diaphragm.

Example 93 may include Example 66, wherein the support region and the electrode are a single construction that supports the diaphragm.

Example 94 may include any one of Examples 66-83 and 87-93, wherein the support region includes at least one mechanical support structure.

Example 95 may include any one of Examples 66-83 and 87-93, wherein the support region includes a plurality of mechanical support structures.

Example 96 may include Example 95, wherein a first structure of the plurality of mechanical support structures further provides an electrical connection to the diaphragm.

Example 97 may include Example 95, wherein a second structure of the plurality of mechanical support structures further provides an electrical connection to the electrode.

Example 98 may include Example 95, wherein a third structure of the plurality of mechanical support structures further provides an electrical connection to a further electrode.

Example 99 may include any one of Examples 66-83 and 87-93, wherein the support region includes three mechanical support structures.

Example 100 may include any one of Examples 66-99, wherein the second continuous region forms a gap configured as a ventilation path between the substrate and the microelectromechanical device.

Example 101 may include Example 100, wherein the ventilation path defines a uniform distance between the substrate and the microelectromechanical device.

Example 102 may include any one of Examples 66-101, wherein the substrate includes a semiconductor.

Example 103 may include any one of Examples 66-102, wherein the microelectromechanical system is embedded an encapsulant.

Example 104 may include any one of Examples 66-103, wherein the microelectromechanical device is mounted on a layer.

Example 105 may include Example 104, wherein the layer includes an insulator and at least one conductive path.

Example 106 may include Example 105, wherein the at least one conductive path includes an electrically conductive material.

Example 107 may include any one of Examples 66-106, wherein the electrode includes an electrically conductive material.

Example 108 may include any one of Examples 66-107, wherein the electrode has a plurality of holes penetrating a thickness of the electrode.

Example 109 may include any one of Examples 66-108, wherein the electrode has a plurality of protrusions configured to prevent static friction to the diaphragm.

Example 110 may include any one of Examples 66-109, wherein the electrode is a predefined distance from the diaphragm.

Example 111 may include any one of Examples 66-110, wherein the electrode and the diaphragm are configured to have an electrically capacitive relationship.

Example 112 may include any one of Examples 66-111, wherein the electrode is located on a first side of the diaphragm and is substantially parallel to the diaphragm.

Example 113 may include any one of Examples 66-112, further including: a further electrode coupled to the diaphragm.

Example 114 may include Example 113, wherein the further electrode is located on a second side of the diaphragm, opposite the first side, and is substantially parallel to the diaphragm.

Example 115 may include any one of Examples 113 and 114, wherein the further electrode has a plurality of holes penetrating a thickness of the further electrode.

Example 116 may include any one of Examples 113-115, wherein the further electrode has a plurality of protrusions configured to prevent static friction to the diaphragm.

Example 117 may include any one of Examples 113-116, wherein the further electrode and the diaphragm are configured to have an electrically capacitive relationship.

Example 118 may include any one of Examples 66-117, wherein the diaphragm includes a corrugated region.

Example 119 may include any one of Examples 66-118, wherein the diaphragm has a plurality of protrusions configured to prevent static friction to at least one of the electrode and a further electrode.

Example 120 may include any one of Examples 66-119, wherein the support region includes a crystalline material.

Example 121 may include any one of Examples 66-120, wherein the support region includes silicon.

Example 122 may include Example 121, wherein the silicon is bulk silicon.

Example 123 may include Example 121, wherein the silicon is polycrystalline silicon.

Example 124 may include any one of Examples 66-123, wherein the support region further includes a dielectric material.

Example 125 may include Example 124, wherein the dielectric material is a silicon oxide.

Example 126 may include any one of Examples 66-125, wherein the support region includes a polymer.

Example 127 may include any one of Examples 66-126, wherein the support region includes a polyimide.

Example 128 may include any one of Examples 66-127, wherein the support region includes a metal.

Example 129 may include any one of Examples 66-128, wherein the diaphragm is configured to actuate.

Example 130 may include Example 129, wherein the diaphragm is actuated by a mechanical interaction, an electric field interaction, or a magnetic field interaction, or any combination thereof.

Example 131 may include Example 130, wherein the electrode provides the electric field interaction or the magnetic field interaction, or any combination thereof.

Example 132 may include Example 129, wherein the electrode provides an electrical signal in response to an actuation of the diaphragm.

Example 133 may include Example 130, wherein the diaphragm is further actuated by a further electric field interaction or a further magnetic field interaction, or any combination thereof.

Example 134 may include Example 133, wherein the further electrode provides the further electric field interaction or the further magnetic field interaction, or any combination thereof.

Example 135 may include Example 130, wherein the further electrode provides a further electrical signal in response to an actuation of the diaphragm.

Example 136 may include any one of Examples 66-135, further including: an electronic circuit.

Example 137 may include Example 136, wherein the electronic circuit receives the electrical signal from the electrode.

Example 138 may include Example 137, wherein the electronic circuit is configured to convert the electrical signal into a digital signal.

Example 139 may include Example 136, wherein the electronic circuit further receives the further electrical signal from the further electrode.

Example 140 may include Example 139, wherein the electronic circuit is configured to convert the further electrical signal into a further digital signal.

Example 141 may include Example 66, wherein providing the second continuous region further comprises: removing a portion of the substrate along the perimeter of the microelectromechanical device from the one end of the support region to the other end.

Example 142 may include Example 141, wherein providing the microelectromechanical device further includes: removing a further portion of the substrate to release the diaphragm and the second continuous region.

Example 143 may include Example 66, wherein providing the support region further comprises: structuring the support region to form at least one mechanical support structure.

Example 144 may include Example 143, wherein structuring the support region further comprises: forming a conductive path to the diaphragm in the support region.

Example 145 may include Example 143, wherein structuring the support region further comprises: forming a conductive path to the electrode in the support region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims, and all changes within the meaning and range of equivalency of the claims are therefore intended to be embraced.

What is claimed is:

1. A microelectromechanical system comprising:
   a substrate;
   a microelectromechanical device comprising:
      a diaphragm configured as a transducer to convert between electrical energy and mechanical energy and
      an electrode coupled to the diaphragm;
   a support region mechanically coupling the microelectromechanical device to the substrate, wherein the support region is confined to a first continuous region spanning an arc of less than 90 degrees around a perimeter of the diaphragm; and
   a second continuous region free from mechanical support of the microelectromechanical device to the substrate, the second continuous region spanning the perimeter of the diaphragm from one end of the support region to the other end of the support region;
   wherein the support region cantilevers the microelectromechanical device and the second continuous region mechanically decouples the microelectromechanical device from the substrate.

2. The microelectromechanical system of claim 1, wherein the support region mechanically fixes the microelectromechanical device to the substrate.

3. The microelectromechanical system of claim 1, wherein the microelectromechanical device and the support region are configured to have a resonant frequency greater than an operational frequency of the microelectromechanical device.

4. The microelectromechanical system of claim 1, wherein the support region further comprises a conductive path coupled with the diaphragm.

5. The microelectromechanical system of claim 1, wherein the support region further comprises a conductive path coupled with the electrode.

6. The microelectromechanical system of claim 1, wherein the support region comprises at least one mechanical support structure.

7. The microelectromechanical system of claim 6, wherein the at least one mechanical support structure is integrally formed with the electrode and is configured as a frame for the diaphragm.

8. The microelectromechanical system of claim 6, wherein one end of the at least one mechanical support is located outside of the first continuous region.

9. The microelectromechanical system of claim 1, wherein the second continuous region forms a gap configured as a ventilation path between the substrate and the microelectromechanical device.

10. The microelectromechanical system of claim 9, wherein the ventilation path defines a uniform distance between the substrate and the microelectromechanical device.

11. The microelectromechanical system of claim 10, wherein the uniform distance is between 3 nm and 3,000 nm.

12. The microelectromechanical system of claim 1, wherein the diaphragm is free from at least one hole that penetrates a thickness of the diaphragm.

13. The microelectromechanical system of claim 1, wherein the diaphragm is configured to be actuated by at least one of the interactions selected from a group consisting of:
   a mechanical interaction;
   an electric field interaction; and
   a magnetic field interaction.

14. The microelectromechanical system of claim 1, further comprising:
   an electronic circuit electrically coupled with the microelectromechanical device configured to output a digital signal corresponding to a voltage across the electrode and the diaphragm.

15. A method for manufacturing a microelectromechanical system comprising:

providing a substrate;

providing a microelectromechanical device comprising:
- a diaphragm configured as a transducer to convert between electrical energy and mechanical energy and
- an electrode coupled to the diaphragm;

providing a support region mechanically coupling the microelectromechanical device to the substrate, wherein the support region is confined to a first continuous region spanning an arc of less than 90 degrees around a perimeter of the diaphragm;

and providing a second continuous region free from mechanical support of the microelectromechanical device to the substrate, the second continuous region spanning the perimeter of the diaphragm from one end of the support region to the other end of the support region;

wherein the support region cantilevers the microelectromechanical device and the second continuous region mechanically decouples the microelectromechanical device from the substrate.

16. The method of claim 15,
wherein providing the second continuous region further comprises:
   removing a portion of the substrate along the perimeter of the microelectromechanical device from the one end of the support region to the other end.

17. The method of claim 16,
wherein providing the microelectromechanical device further includes:
   removing a further portion of the substrate to release the diaphragm and the second continuous region.

18. The method of claim 15,
wherein providing the support region further comprises:
   structuring the support region to form at least one mechanical support structure.

19. The method of claim 18,
wherein structuring the support region further comprises:
   forming a conductive path to the diaphragm in the support region.

20. The method of claim 18,
wherein structuring the support region further comprises:
   forming a conductive path to the electrode in the support region.

* * * * *